United States Patent [19]
Takeyama et al.

[11] Patent Number: 5,734,286
[45] Date of Patent: Mar. 31, 1998

[54] DRIVING DEVICE OF CHARGE PUMP CIRCUIT AND DRIVING PULSE GENERATION METHOD THEREOF

[75] Inventors: Yasuhisa Takeyama, Kawasaki; Junichi Miyamoto, Yokohama; Yoshihisa Iwata, Yokohama; Hironori Banba, Kawasaki; Hideko Oodaira, Tokyo, all of Japan

[73] Assignee: Kabushiki Kaisha Toshiba, Kawasaki, Japan

[21] Appl. No.: 245,770

[22] Filed: May 18, 1994

[30] Foreign Application Priority Data

May 19, 1993 [JP] Japan .................... 5-117274

[51] Int. Cl.$^6$ .................... H03K 5/15; G05F 1/46
[52] U.S. Cl. .................... 327/295; 327/291; 327/536; 327/537; 331/74; 365/185.27
[58] Field of Search .................... 327/536, 537, 327/245, 242, 241, 258, 239, 295, 299, 333, 151, 172, 175, 415, 259, 534, 291, 160, 249, 253, 265, 273, 279, 286; 365/185.27; 331/57, 74

[56] References Cited

U.S. PATENT DOCUMENTS

| | | |
|---|---|---|
| 4,014,352 | 3/1977 | Jamieson .................... 327/273 |
| 4,345,211 | 8/1982 | Longworth .................... 327/160 |
| 4,438,346 | 3/1984 | Chuang et al. .................... 327/536 |
| 4,613,827 | 9/1986 | Takamori et al. .................... 331/27 |
| 4,877,974 | 10/1989 | Kawai et al. .................... 327/295 |
| 4,882,505 | 11/1989 | Furman .................... 327/295 |
| 5,039,950 | 8/1991 | McDermott .................... 327/258 |
| 5,049,766 | 9/1991 | Van Driest et al. .................... 327/273 |
| 5,103,192 | 4/1992 | Sekine et al. .................... 327/157 |
| 5,126,590 | 6/1992 | Chern .................... 327/537 |
| 5,140,182 | 8/1992 | Ichimura .................... 327/536 |
| 5,202,588 | 4/1993 | Matsuo et al. .................... 327/536 |
| 5,230,013 | 7/1993 | Hanke et al. .................... 327/245 |
| 5,315,270 | 5/1994 | Leonowich .................... 331/25 |
| 5,317,283 | 5/1994 | Korhonen .................... 327/159 |
| 5,343,088 | 8/1994 | Jeon .................... 327/537 |
| 5,343,167 | 8/1994 | Masumoto et al. .................... 331/17 |
| 5,351,015 | 9/1994 | Masumoto et al. .................... 331/1 R |
| 5,394,372 | 2/1995 | Tanaka et al. .................... 327/536 |
| 5,394,443 | 2/1995 | Byers et al. .................... 327/295 |

*Primary Examiner*—Timothy P. Callahan
*Assistant Examiner*—Terry L. Englund
*Attorney, Agent, or Firm*—Banner & Witcoff, Ltd.

[57] ABSTRACT

A semiconductor circuit device includes an oscillator for outputting an oscillating signal, a driving signal generator for generating driving signals having respective phases based on a counting of oscillations of the oscillating signal, and a charge pump circuit driven by the driving signals. A pulse width ratio of the driving signals to one another is constant even when an oscillation period of the oscillating signal output by the oscillator changes, whereby the charge pump operates properly under changing conditions.

29 Claims, 19 Drawing Sheets

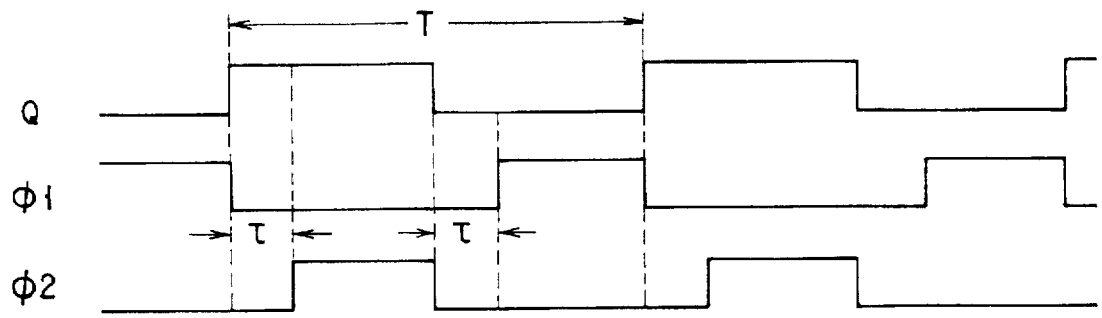
F I G. 4A    (PRIOR ART)
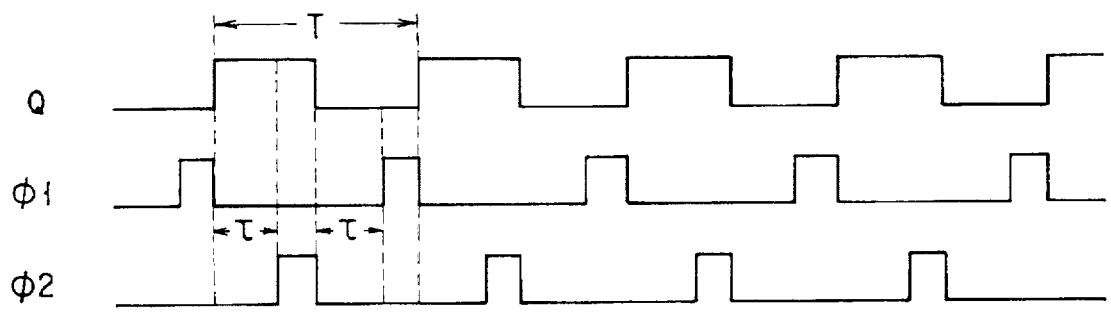
F I G. 4B    (PRIOR ART)
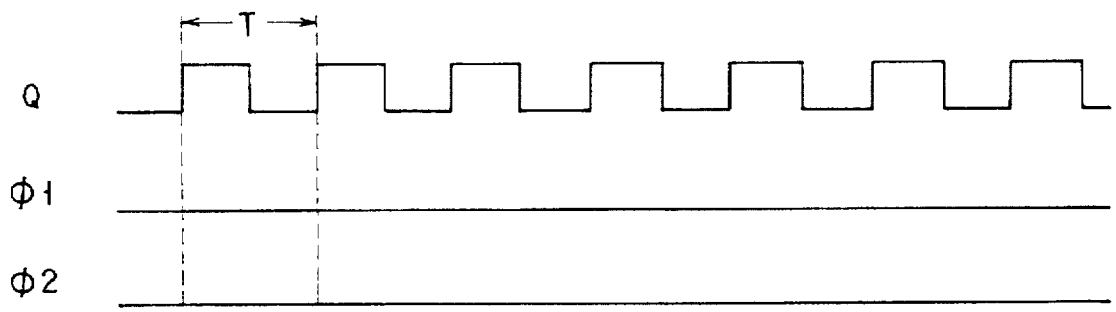
F I G. 4C    (PRIOR ART)

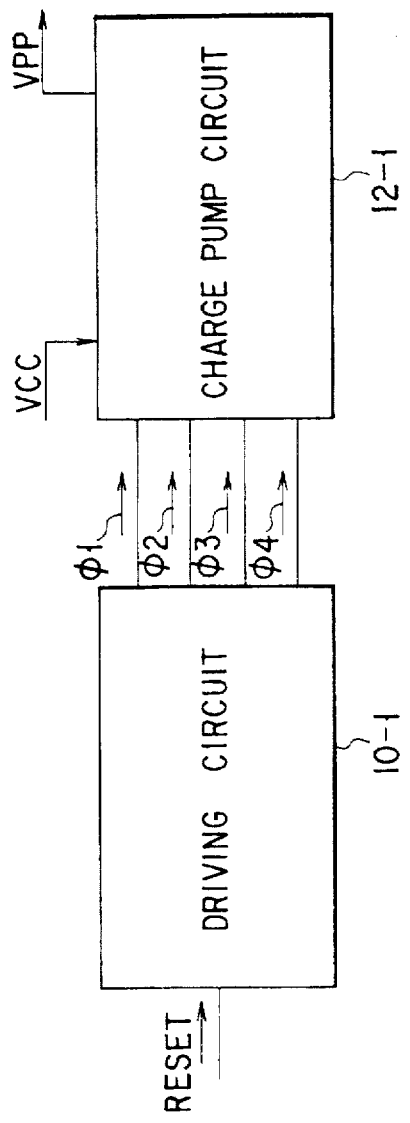
F I G. 5
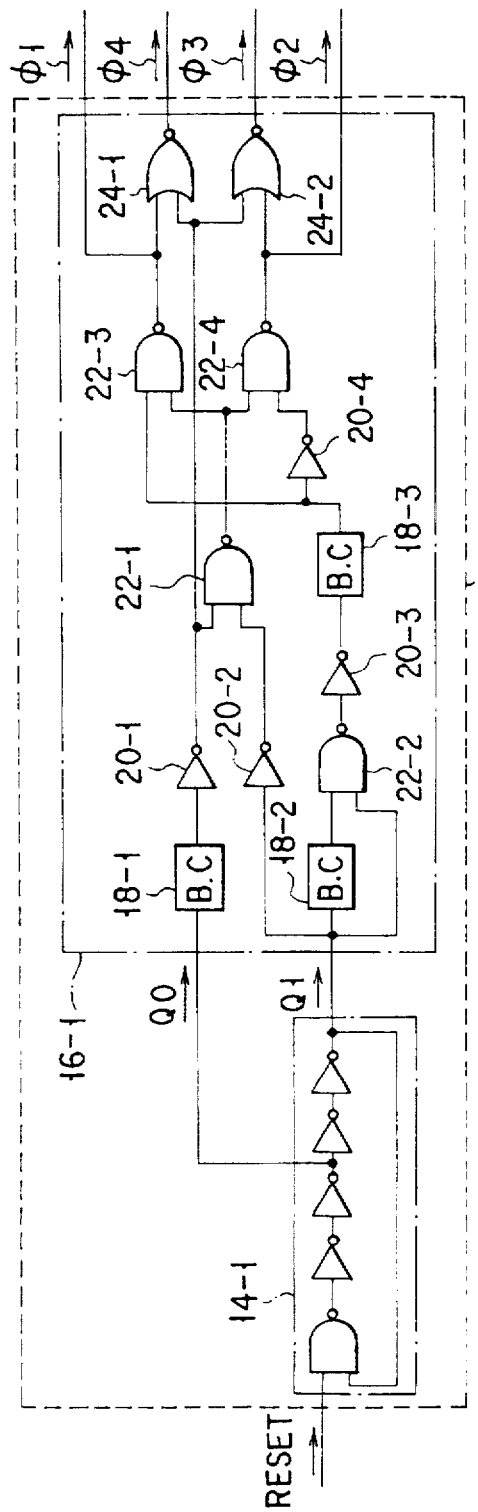
F I G. 6

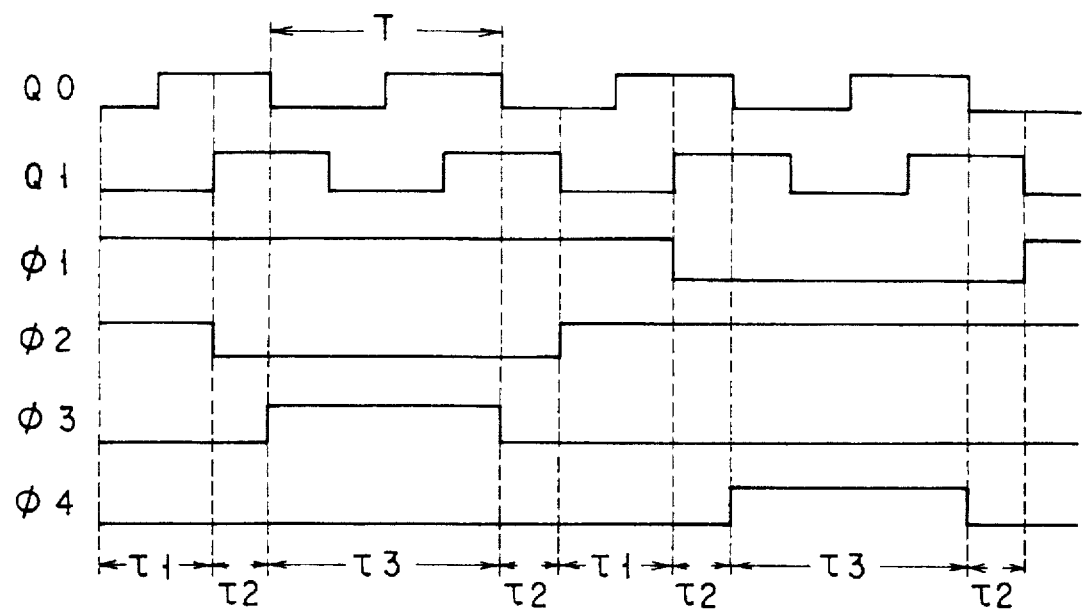
F I G. 9A
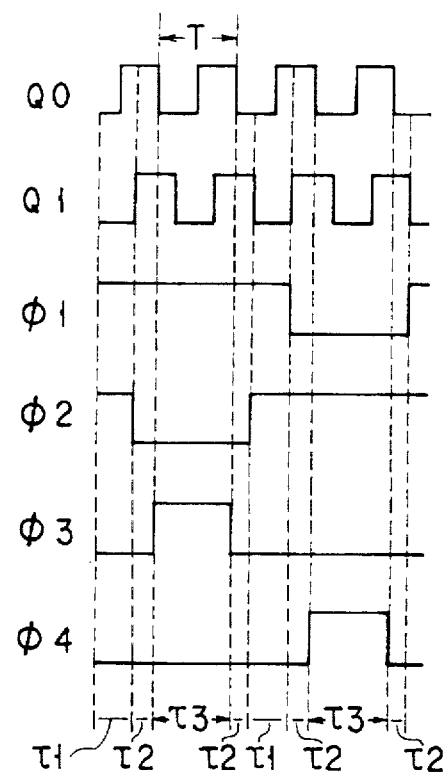
F I G. 9B

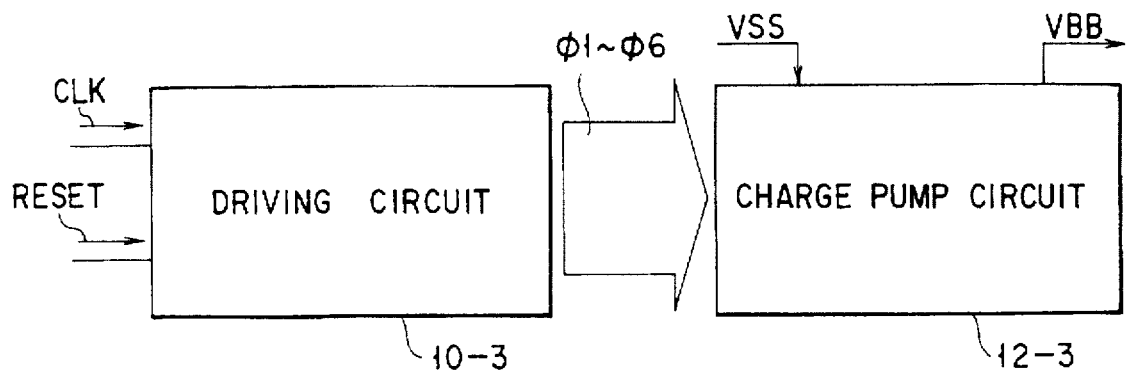
F I G. 16
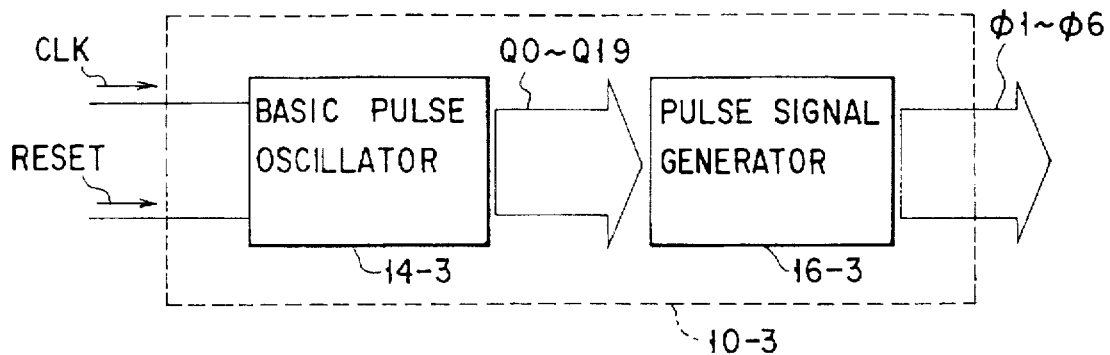
F I G. 17
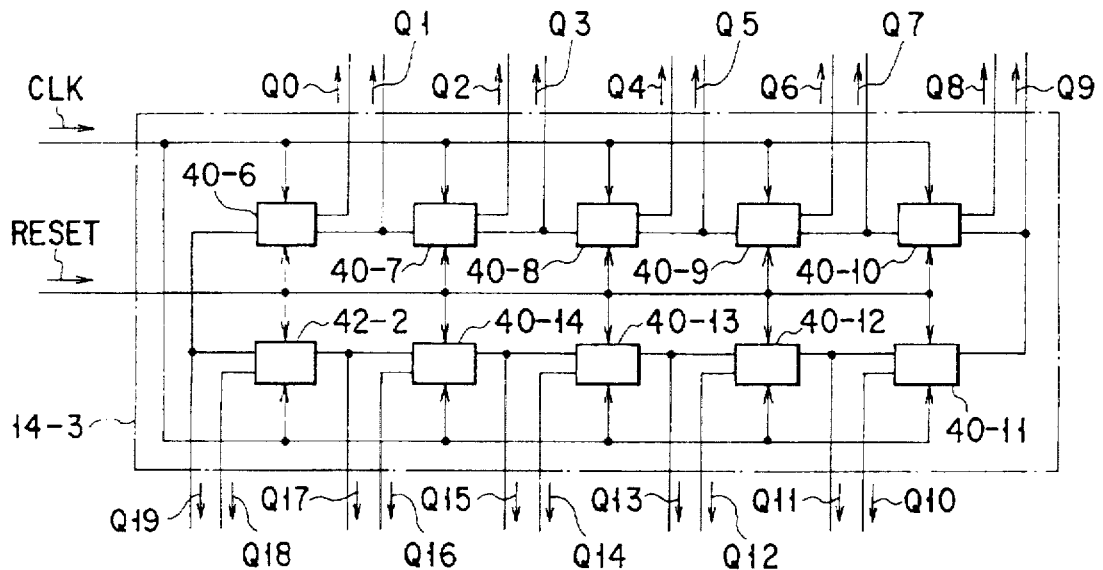
F I G. 18

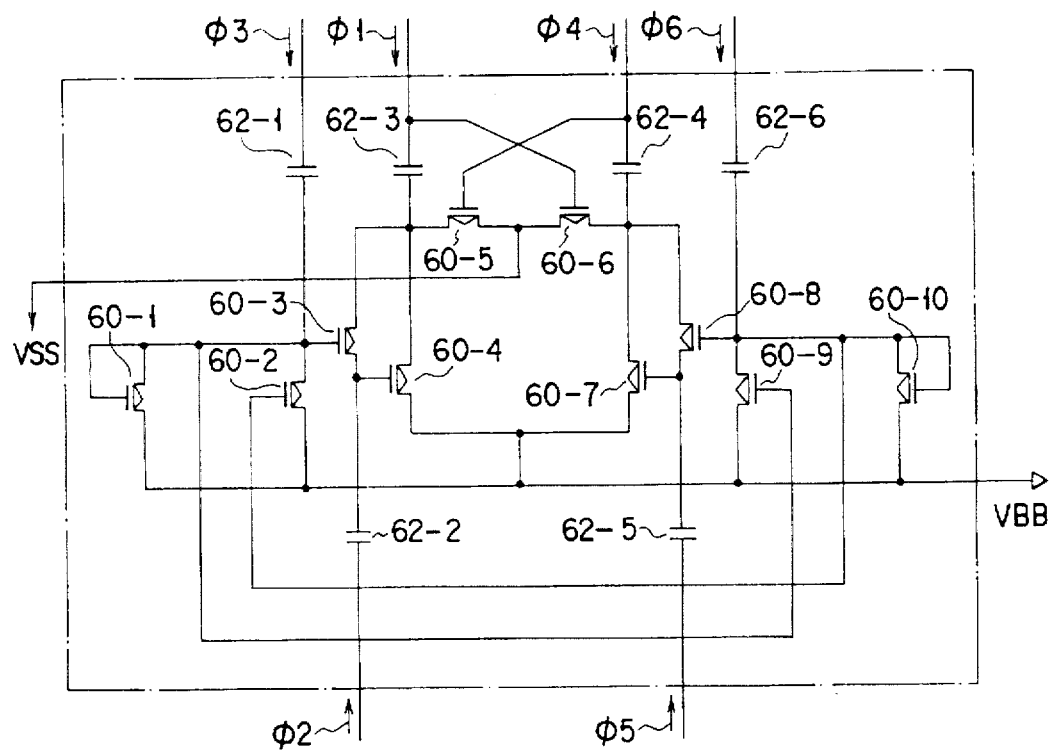
F I G. 22
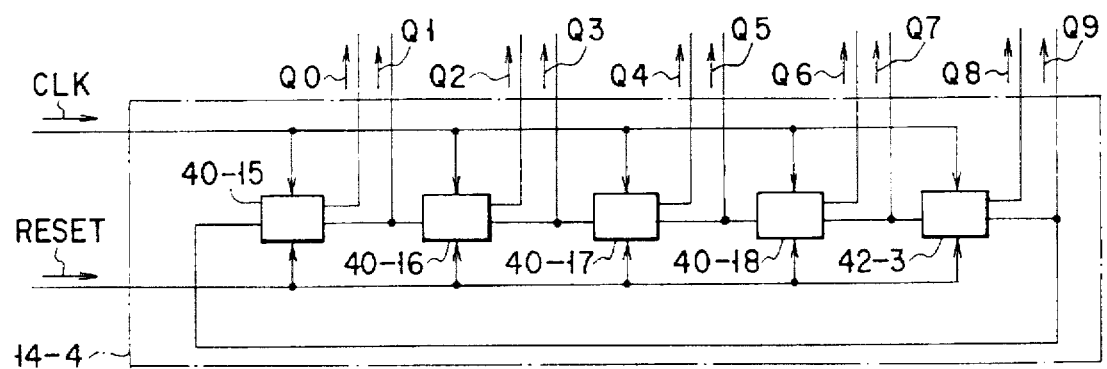
F I G. 23

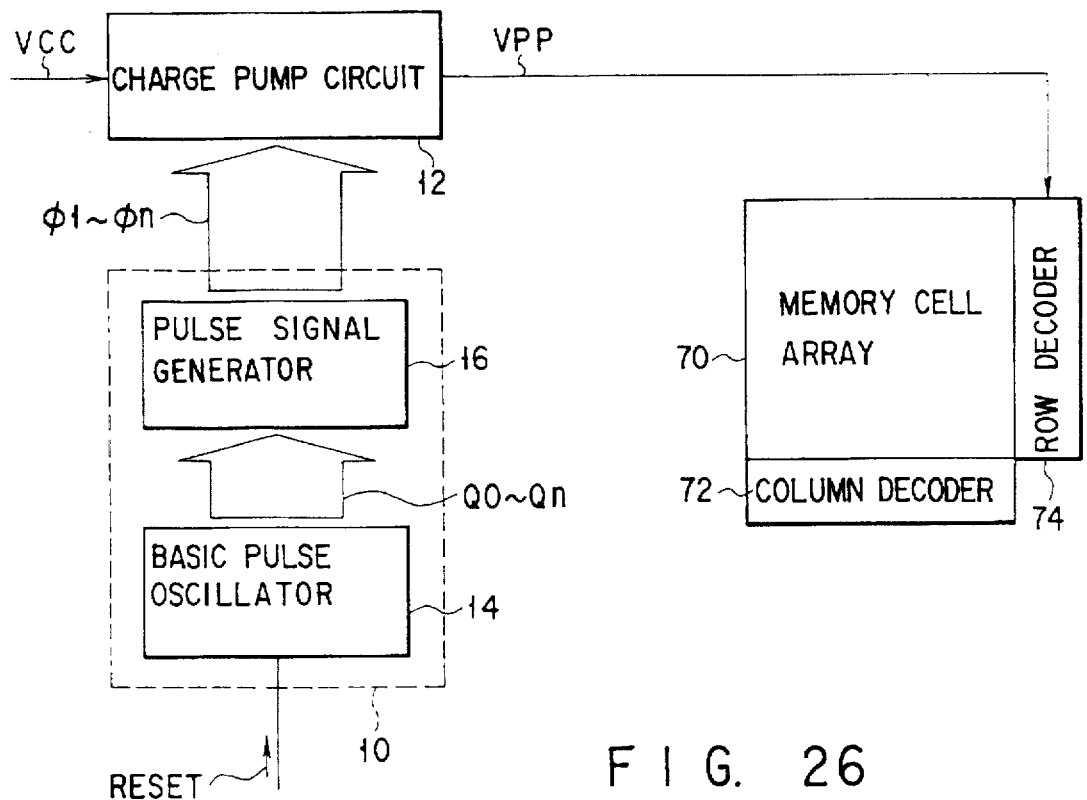
F I G. 26
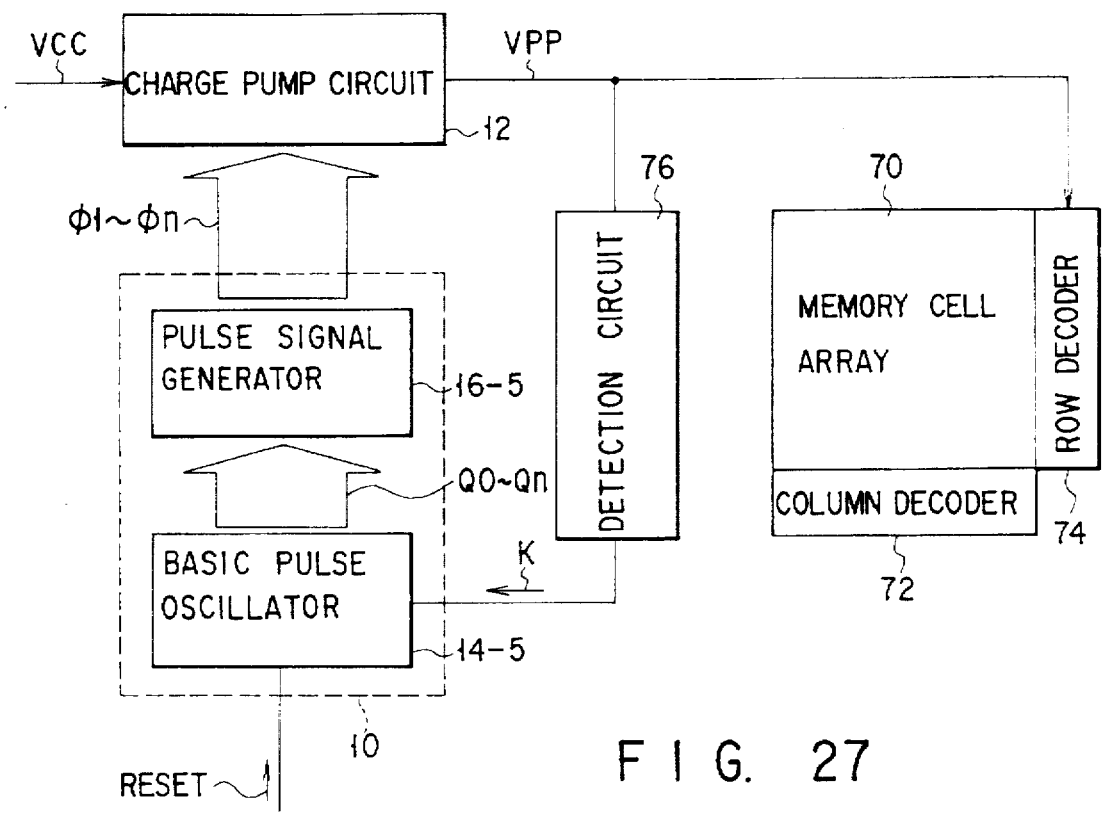
F I G. 27

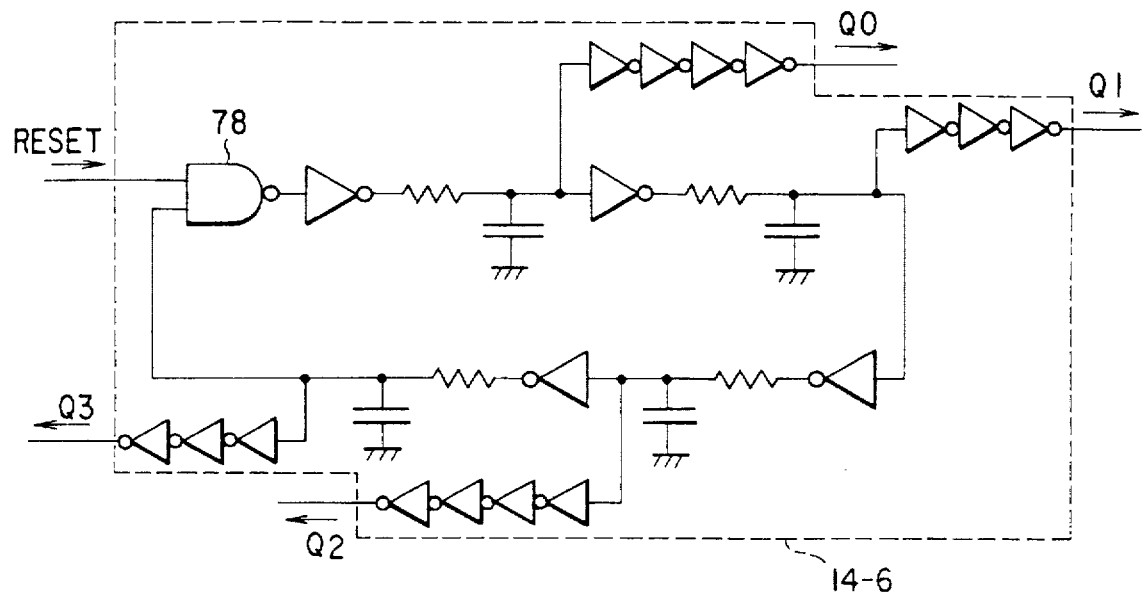
F I G. 34
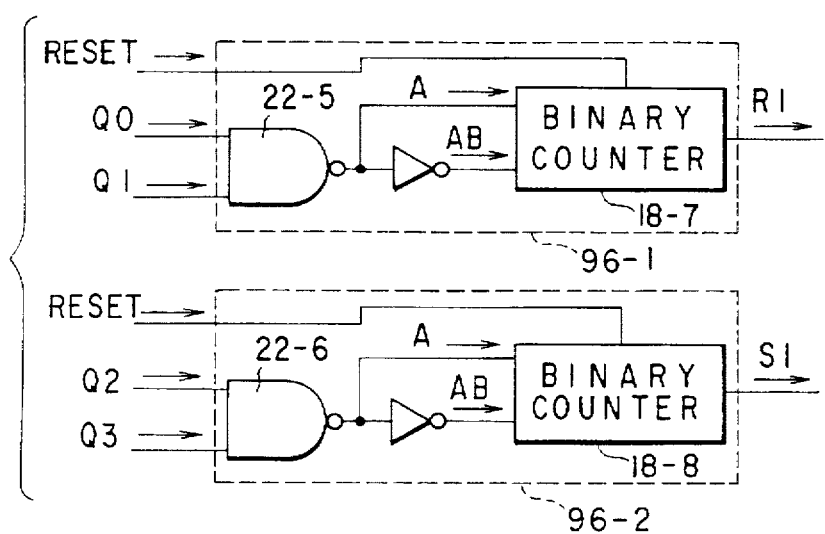
F I G. 35

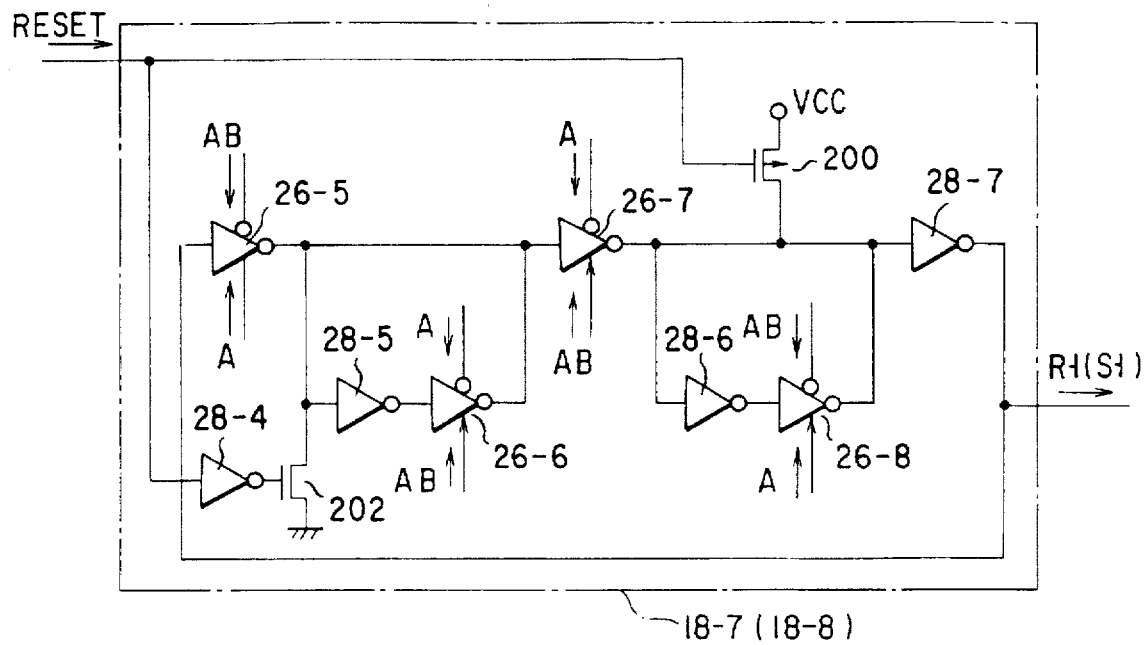
F I G. 36
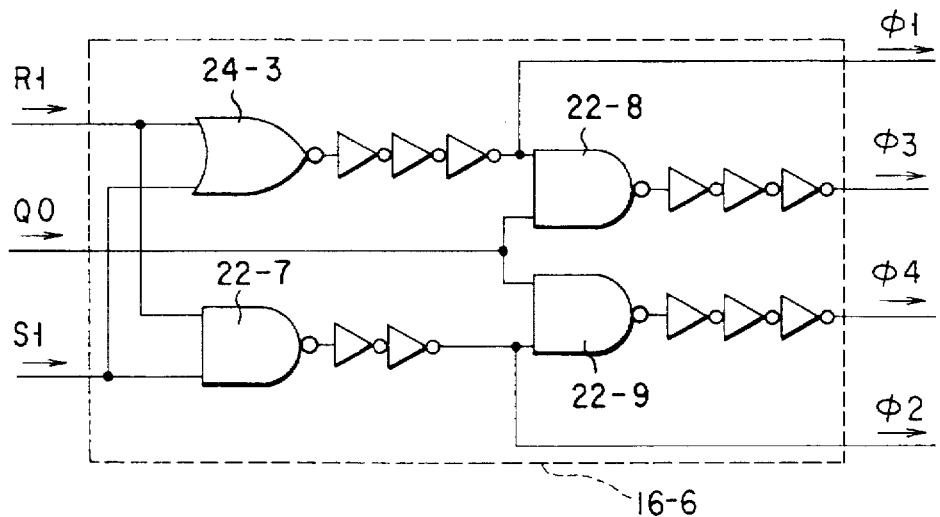
F I G. 37

DRIVING DEVICE OF CHARGE PUMP CIRCUIT AND DRIVING PULSE GENERATION METHOD THEREOF

BACKGROUND OF THE INVENTION

1. Field of the Invention

This invention relates to a semiconductor circuit device and a pulse generation circuit thereof, and more particularly to a driving circuit device for driving a charge pump circuit and a method for driving a charge pump circuit.

2. Description of the Related Art

Conventionally, as a circuit device for creating a potential of a positive value or negative value, which are different from a power source voltage or a ground potential VSS, a charge pump circuit is well known in the art. The charge pump circuit is used in an EEPROM or a dynamic RAM and the like, and is used to create a positive voltage VPP which is higher than a power source voltage VCC or a negative voltage VBB which is lower than a ground potential VSS, for example.

Generally the charge pump circuit is driven by pulse signals of different phases.

FIG. 1 is a block diagram showing a typical example of a driving circuit for generating the above pulse signals to drive the charge pump circuit.

As shown in FIG. 1, a driving circuit 100 is supplied with a reset signal RESET for permitting the initializing operation. The driving circuit 100 outputs 2-phase pulse signals $\phi1$, and $\phi2$ in response to the reset signal RESET. The pulse signals $\phi1$, and $\phi2$ are input to a charge pump circuit 102. The charge pump circuit 102 generates a positive voltage VPP which is higher than a power source voltage VCC from the power source voltage VCC in response to the pulse signals $\phi1$, $\phi2$.

FIG. 2 is a circuit diagram showing a conventional example of the driving circuit of FIG. 1.

The driving circuit 100 includes a basic pulse oscillator 104 and a pulse signal generator 106. The generator 106 is constructed by a delay circuit 108 and various types of logic gates.

First, the oscillator 104 generates a basic pulse Q when receiving a reset signal RESET. The basic pulse Q is input to the generator 106. The basic pulse Q is directly input to the first input terminal of a NAND gate 110 and the first input terminal of a NOR gate 112 in the generator 106. Further, it is input to the second input terminal of the NAND gate 110 and the second input terminal of the NOR gate 112 via the delay circuit 108. An output of the NOR gate 112 is used as a first pulse $\phi1$ and an output of the NAND gate 110 is supplied via an inverter 114 and then used as a second pulse $\phi2$.

FIG. 3 is a waveform diagram showing an input waveform and output waveforms of the generator 106 of FIG. 2.

As shown in FIG. 3, at time when the basic pulse Q is changed from the "L" level to the "H" level (which is hereinafter referred to as "rise" in this description), the first pulse $\phi1$ is changed from the "H" level to the "L" level (which is hereinafter referred to as "fall" in this description). The second pulse $\phi2$ rises with a delay of a preset time $\tau$ from the above time. The second pulse $\phi2$ falls when the basic pulse Q falls. The first pulse $\phi1$ rises with delay of the preset time $\tau$ after the above time and falls when the basic pulse Q rises.

In a semiconductor integrated circuit, the characteristics of various elements such as transistors, resistors and capacitors constructing the integrated circuit will vary depending on the power source voltage, temperature and fluctuation in the semiconductor manufacturing process such as threshold voltage of transistor, gate width, and gate length, etc. Therefore, the circuit characteristics may be different from each other in constructions having different combinations of the elements.

In the driving circuit 100 as shown in FIG. 2, the oscillator 104 and delay circuit 108 are combined to create the pulse signals $\phi1$, $\phi2$. Particularly, the delay circuit 108 is constructed by series-connected inverters 116, 118. The dependency of the oscillator 104 and that of the delay circuit 108 are different from each other. The difference in the degree of dependency causes a difference in the degree of influence on the circuit characteristics. As a result, it becomes difficult to stably attain the matching between pulse signals created by the oscillator 104 and delay circuit 108.

FIGS. 4A to 4C are diagrams for illustrating a case wherein it becomes impossible to maintain the matching between the pulse signals.

FIG. 4A shows a case wherein the period T of the basic pulse Q is elongated (the frequency is lowered). At this time, the "H" level output period of the pulses $\phi1$, $\phi2$ becomes long and the delay time $\tau$ becomes relatively short. For this reason, no operation margin can be set for the delay time, and when taking a variation in the characteristics of other circuits, for example, a variation in the gate characteristics for logical combinations into consideration, the possibility that the pulses $\phi1$, $\phi2$ overlap each other may be considered. If the pulses $\phi1$, $\phi2$ overlap each other, the charge transfer efficiency of the charge pump circuit 102 is lowered.

Further, even if the pulses $\phi1$, $\phi2$ do not overlap each other, the frequencies of the pulses $\phi1$, $\phi2$ are lowered as the oscillation frequency of the oscillator 104 becomes lower, and as a result, the operation of the pump circuit 102 becomes dull and the voltage raising speed thereof is lowered. In order to solve the above problem, the capacitance of the capacitor of the charge pump circuit 102 may be increased, but this causes an increase in the area of the circuit pattern, thereby lowering the integration density.

FIG. 4B shows a case wherein the period T of the basic pulse Q becomes shorter (the frequency becomes higher). At this time, in contrast to the above case, the "H" level output period of the pulses $\phi1$, $\phi2$ becomes short and the delay time $\tau$ becomes relatively longer. When the frequency of the basic pulse Q is further increased and the delay time $\tau$ becomes equal to or longer than half the period of the basic pulse Q, the generator 106 is set into a state in which substantially no pulses $\phi1$, $\phi2$ are generated as shown in FIG. 4C.

As described above, in the semiconductor circuit device having the conventional driving circuit device, there occurs a problem that the matching between the pulse signals cannot be maintained by a variation in the condition, a pulse waveform pattern different from a desired pulse waveform pattern is generated, and the charge pump circuit 102 is not normally operated.

SUMMARY OF THE INVENTION

A first object of this invention is to provide a semiconductor circuit device including a circuit capable of always generating a pulse signal even if the period of an input signal is changed and a method for creating the pulse signal.

A second object of this invention is to provide a semiconductor circuit device capable of always generating a plurality of pulse signals of different phases with the pulse width ratio of each pulse thereof kept constant even if the characteristics of circuit elements vary for each circuit element and a method for creating the pulse signals.

A third object of this invention is to provide a driving device capable of always normally driving a charge pump circuit even if the period of an input signal is changed and a method for generating a driving pulse.

A fourth object of this invention is to provide a driving device for a charge pump circuit which can simultaneously attain the high speed operation and reduction in the power consumption in addition to the third object and a method for generating a driving pulse.

In order to attain the above first and second objects, in this invention, there is provided a semiconductor circuit device comprising means for receiving and counting at least one of basic pulses to generate a plurality of driving pulses; and a circuit driven by the plurality of driving pulse.

In order to attain the above third object, in this invention, there is provided a semiconductor circuit device comprising an oscillator; a generator for counting an oscillator output of the oscillator and generating a plurality of driving pulse signals of different phases according to the counting state; and a potential level shifting circuit driven by the plurality of driving pulse signals, for shifting a first potential level to a second potential level which is different from the first potential level.

In order to attain the above fourth object, in this invention, there is provided a semiconductor circuit device comprising an oscillator; a generator for counting an oscillator output of the oscillator and generating a plurality of driving pulse signals of different phases according to the counting state; a potential level shifting circuit driven by the plurality of driving pulse signals, for shifting a first potential level to a second potential level which is different from the first potential level; and means for changing the oscillation period of the oscillator according to the second potential level.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 4A to 4C are waveform diagrams for illustrating a case wherein the matching between the pulse signals is lost;

FIG. 5 is a schematic block diagram showing a semiconductor circuit device including a charge pump circuit and a driving circuit thereof according to a first embodiment of this invention;

FIG. 6 is a circuit diagram showing the driving circuit of FIG. 5;

FIG. 9A is a waveform diagram showing a case wherein the period of an input pulse of the pulse signal generator of FIG. 6 becomes longer than that of a case of FIG. 8;

FIG. 9B is a waveform diagram showing a case wherein the period of an input pulse of the pulse signal generator of FIG. 6 becomes shorter than that of a case of FIG. 8;

FIG. 16 is a schematic block diagram showing a semiconductor circuit device including a charge pump circuit and a driving circuit thereof according to a third embodiment of this invention;

FIG. 17 is a block diagram showing the driving circuit of FIG. 16;

FIG. 18 is a circuit diagram showing a basic pulse oscillator of FIG. 17;

FIG. 22 is a circuit diagram of the charge pump circuit shown in FIG. 16;

FIG. 23 is a circuit diagram showing a basic pulse oscillator contained in a semiconductor circuit device according to a fourth embodiment of this invention;

FIG. 26 is a schematic block diagram showing the construction of a nonvolatile semiconductor memory containing a semiconductor circuit device according to this invention;

FIG. 27 is a schematic block diagram showing a semiconductor circuit device according to a fifth embodiment of this invention;

FIG. 34 is a circuit diagram of the ring oscillator used in the device of in FIG. 32;

FIG. 35 is a block diagram showing the two delay circuits incorporated in the device shown in FIG. 32;

FIG. 36 is a circuit diagram showing one of the two identical binary counters shown in FIG. 35; and FIG. 37 is a circuit diagram of the pulse signal generator used in the device of FIG. 32.

DETAILED DESCRIPTION OF THE PREFERRED EMBODIMENTS

Figure 1:
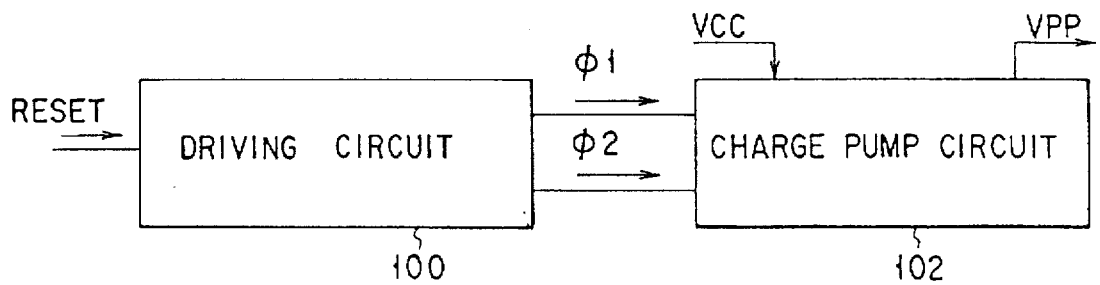
FIG. 1 is a typical block diagram showing a semiconductor circuit device including a charge pump circuit and a driving circuit therefor.
Figure 2:
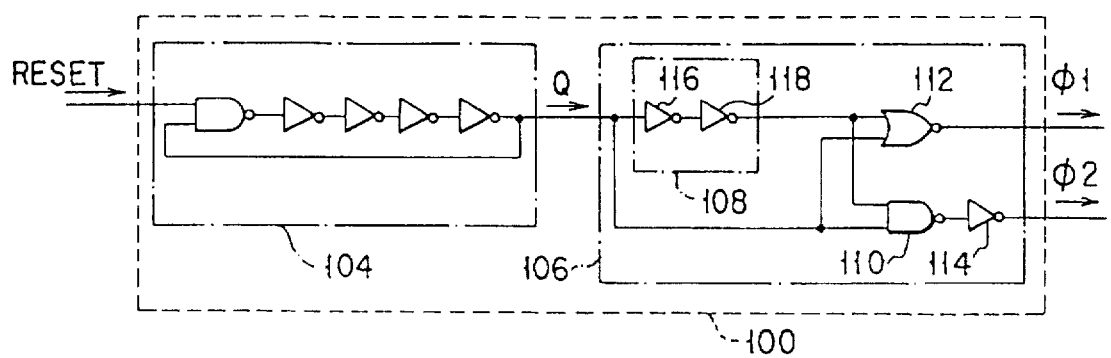
FIG. 2 is a prior art circuit diagram showing the driving circuit of FIG. 1.
Figure 3:
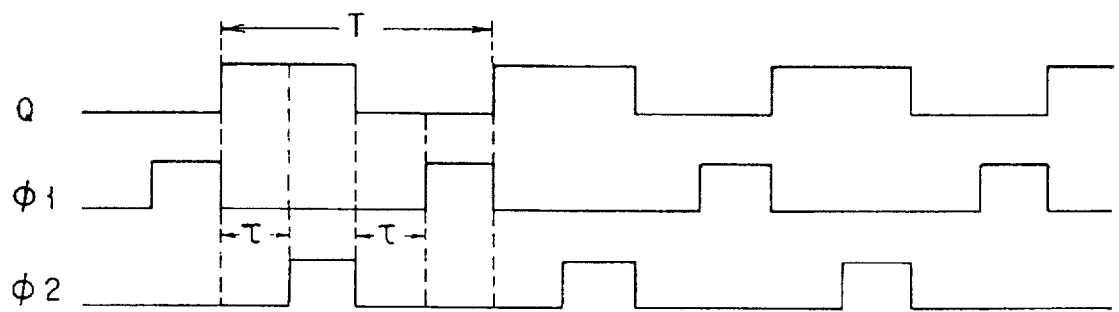
FIG. 3 is a waveform diagram showing an input waveform and output waveforms of a pulse signal generator of FIG. 2.

There will now be described an embodiment of this invention with reference to the accompanying drawings. In this explanation, the same reference numerals are attached to substantially the same portions throughout the drawings so as to omit the redundant and repetitive explanation.

Figure 7:
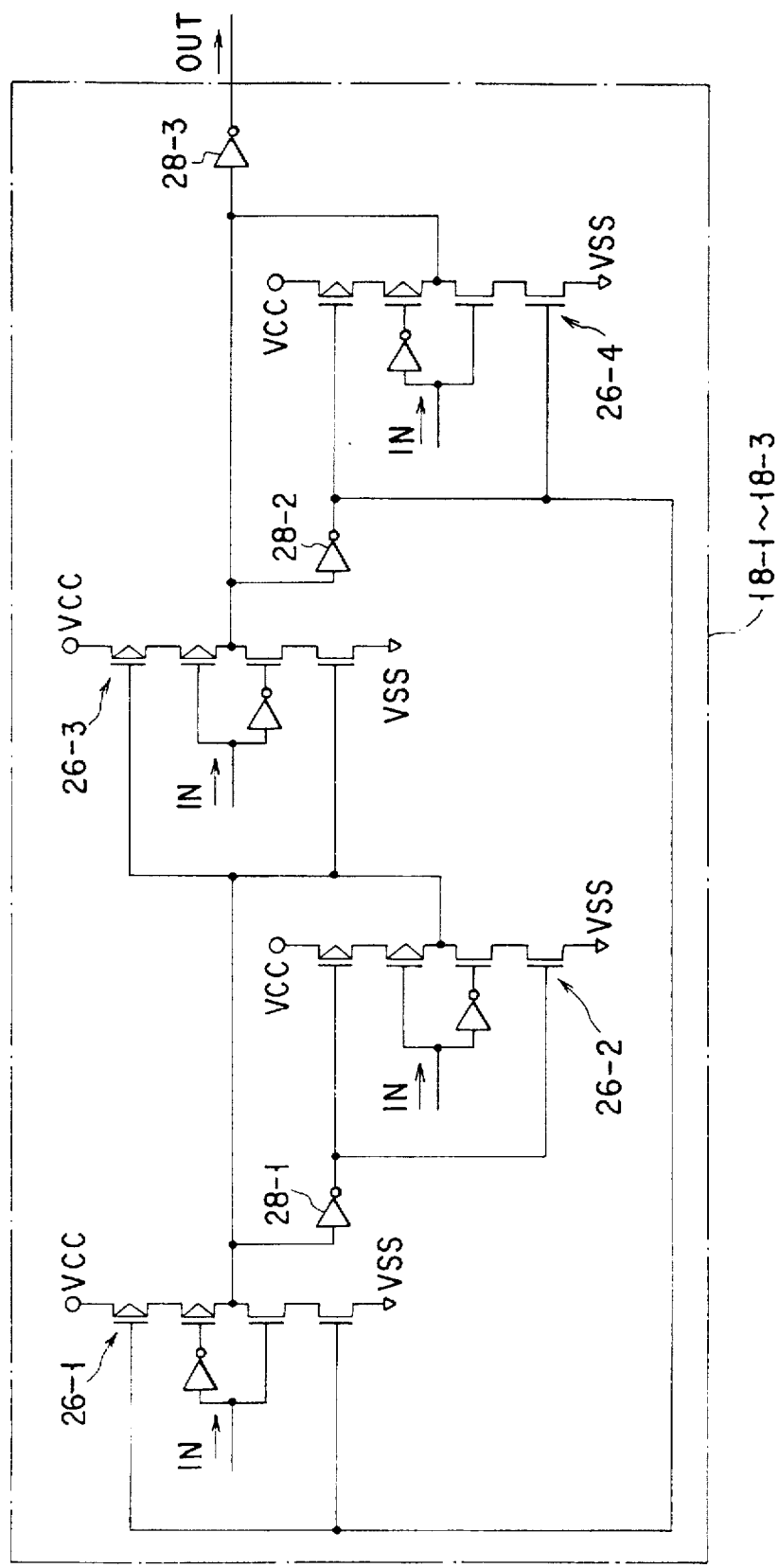
FIG. 7 is a circuit diagram showing a counter circuit of FIG. 6.

FIG. 5 is a block diagram showing the schematic construction of a semiconductor circuit device according to a first embodiment of this invention, FIG. 6 is a circuit diagram showing the construction of a driving circuit contained in the semiconductor circuit device according to the first embodiment of this invention, and FIG. 7 is a circuit diagram showing the construction of a counter circuit of FIG. 6.

First, the schematic construction of the semiconductor circuit device according to the first embodiment of this invention is explained.

As shown in FIG. 5, a driving circuit 10-1 is supplied with a reset signal RESET for permitting the initializing operation. The driving circuit 10-1 outputs 4-phase pulse signals $\phi 1$, $\phi 2$, $\phi 3$ and $\phi 4$ in response to the reset signal RESET. The pulse signals $\phi 1$ to $\phi 4$ are input to a charge pump circuit 12-1. The charge pump circuit 12-1 generates a voltage VPP which is higher than a power source voltage VCC from the power source voltage VCC in response to the pulse signals $\phi 1$ to $\phi 4$.

Next, the driving circuit 10-1 contained in the semiconductor circuit device according to the first embodiment is explained.

As shown in FIG. 6, the driving circuit 10-1 includes a basic pulse oscillator 14-1 and a pulse signal generator 16-1. The generator 16-1 is constructed by binary counter circuits 18-1, 18-2, 18-3 and various types of logic gates.

First, the oscillator 14-1 generates a first basic pulse Q0 and a second basic pulse Q1 when receiving a reset signal RESET. The period of the first basic pulse Q0 is the same as the period T of the second basic pulse Q1, and the second basic pulse Q1 is delayed with respect to the first basic pulse Q0 by a quarter of the period.

Further, the basic pulses Q0 and Q1 may be supplied from an exterior circuit.

The first basic pulse Q0 is input to the first binary counter 18-1. The output terminal of the first binary counter 18-1 is connected to the input terminal of the inverter 20-1 and the output terminal of the inverter 20-1 is connected to the first input terminal of a NAND gate 22-1, the first input terminal of a NOR gate 24-1 and the first input terminal of a NOR gate 24-2. An output of the NOR gate 24-1 is used as a fourth pulse signal $\phi 4$ and an output of the NOR gate 24-2 is used as a third pulse signal $\phi 3$.

The second basic pulse Q1 is input to the second binary counter 18-2, the input terminal of the inverter 20-2 and the first input terminal of a NAND gate 22-2. The output terminal of the inverter 20-2 is connected to the second input terminal of the NAND gate 22-1. The output terminal of the NAND gate 22-1 is connected to the first input terminal of a NAND gate 22-3 and the first input terminal of a NAND gate 22-4.

The output terminal of the second binary counter 18-2 is connected to the second input terminal of the NAND gate 22-2. The output terminal of the NAND gate 22-2 is connected to the input terminal of the inverter 20-3. The output terminal of the inverter 20-3 is connected to the input terminal of the third binary counter 18-3. The output terminal of the third binary counter 18-3 is connected to the second input terminal of the NAND gate 22-3 and the input terminal of the inverter 20-4. The output terminal of the inverter 20-4 is connected to the second input terminal of the NAND gate 22-4.

An output of the NAND gate 22-3 is used as a first pulse signal $\phi 1$ and the output terminal thereof is connected to the second input terminal of the NOR gate 24-1.

Further, an output of the NAND gate 22-4 is used as a second pulse signal $\phi 2$ and the output terminal thereof is connected to the second input terminal of the NOR gate 24-2.

Next, the construction of the binary counters 18-1 to 18-3 is explained.

As shown in FIG. 7, the binary counter includes clocked inverters 26-1, 26-2, 26-3 and 26-4 set into the ON/OFF state in response to an input signal IN used as a clock signal. The clocked inverters 26-1 and 26-4 are driven by the in-phase clocks and the clocked inverters 26-2 and 26-3 are driven by clocks of inverted phase.

The output terminal of the clocked inverter 26-1 is connected to the input terminal of an inverter 28-1 of normal construction and the input terminal of the clocked inverter 26-3. The output terminal of the inverter 28-1 is connected to the input terminal of the clocked inverter 26-2 and the output terminal of the clocked inverter 26-2 is connected to the input terminal of the clocked inverter 26-3.

The output terminal of the clocked inverter 26-3 is connected to the input terminal of an inverter 28-2 of normal construction and the input terminal of an inverter 28-3 of normal construction. The output terminal of the inverter 28-2 is connected to the input terminal of the clocked inverter 26-4 and the input terminal of the clocked inverter 26-1. The output terminal of the clocked inverter 26-4 is connected to the input terminal of the inverter 28-3 of normal construction. An output of the inverter 28-3 is used as an output signal OUT.

In the first binary counter 18-1 shown in FIG. 6, an input signal IN is the first basic pulse Q0 and an output signal thereof is supplied to the inverter 20-1. Likewise, in the second binary counter 18-2, an input signal IN is a second basic pulse Q1. The output signal OUT is supplied to the NAND gate 22-2. In the third binary counter 18-3, an input signal IN is an output signal of the inverter 20-3, and the output signal OUT is supplied to the second input terminal of the NAND gate 22-3 and the inverter 20-4.

In the binary counter shown in FIG. 7, a circuit for permitting the initializing operation thereof may be provided.

In the operation of the binary counter shown in FIG. 7, the output signal OUT rises or falls at time that the input signal IN falls. However, when the input signal IN rises, the output signal OUT is kept unchanged.

Next, the operation of the pulse signal generator 16-1 shown in FIG. 6 is explained.

Figure 8:
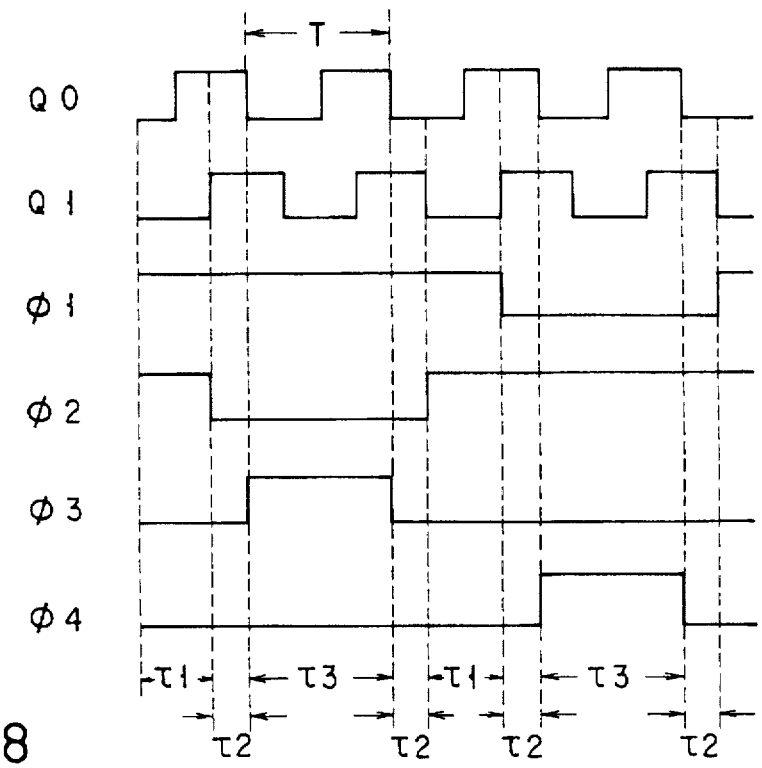
FIG. 8 is a waveform diagram showing an input waveform and output waveforms of a pulse signal generator of FIG. 6.

FIG. 8 is a waveform diagram showing an input waveform and output waveforms of the generator of FIG. 6.

In FIG. 8, a reference symbol T indicates a period of the first basic pulse Q0 or second basic pulse Q1. The period τ1 indicates a period from the rise of the first pulse signal φ1 to the fall of the second pulse φ2 and a period from the rise of the second pulse signal φ2 to the fall of the first pulse signal φ1.

Likewise, the period τ2 indicates a period from the fall of the second pulse signal φ2 to the rise of the third pulse φ3 and a period from the fall of the third pulse signal φ3 to the rise of the second pulse signal φ2. Also, the period τ2 indicates a period from the fall of the first pulse signal φ1 to the rise of the fourth pulse φ4 and a period from the fall of the fourth pulse signal φ4 to the rise of the first pulse signal φ1.

The period τ3 indicates a period in which the third pulse signal φ3 and a period in which fourth pulse signal φ4 are set at the "H" level.

When the generator 16-1 is constructed as shown in FIG. 6, the operation timing ratio is set as indicated by the following equation (1).

$$\tau1:\tau2:\tau3=2:1:4 \qquad (1)$$

FIG. 9A shows a case wherein the period T of the first basic pulse Q0 and second basic pulse Q1 becomes long (the frequency becomes low), and FIG. 9B shows a case wherein the period T of the first basic pulse Q0 and second basic pulse Q1 becomes short (the frequency becomes high).

According to the semiconductor circuit device according to the first embodiment of this invention, even if the period of the basic pulses Q0 and Q1 generated by the oscillator 14-1 is varied by the dependency on the power source voltage VCC, threshold voltage Vth of transistors, and variation in temperature, the matching between the pulse signals can be stably attained and the operation timing can be made constant, because the pulse signals φ1 to φ4 are generated by counting directly the basic pulses Q0 and Q1 in the generator 16-1.

Therefore, as shown in FIGS. 9A and 9B, the set operation timing ratio can be always stably maintained irrespective of a variation in the frequency of the basic pulse even if the frequency of the basic pulse is changed. In the first embodiment, the relation of τ1:τ2:τ3=2:1:4 can be maintained irrespective of a variation in the frequency of the basic pulses Q0 and Q1.

Next, the charge pump circuit is explained.

Figure 10:
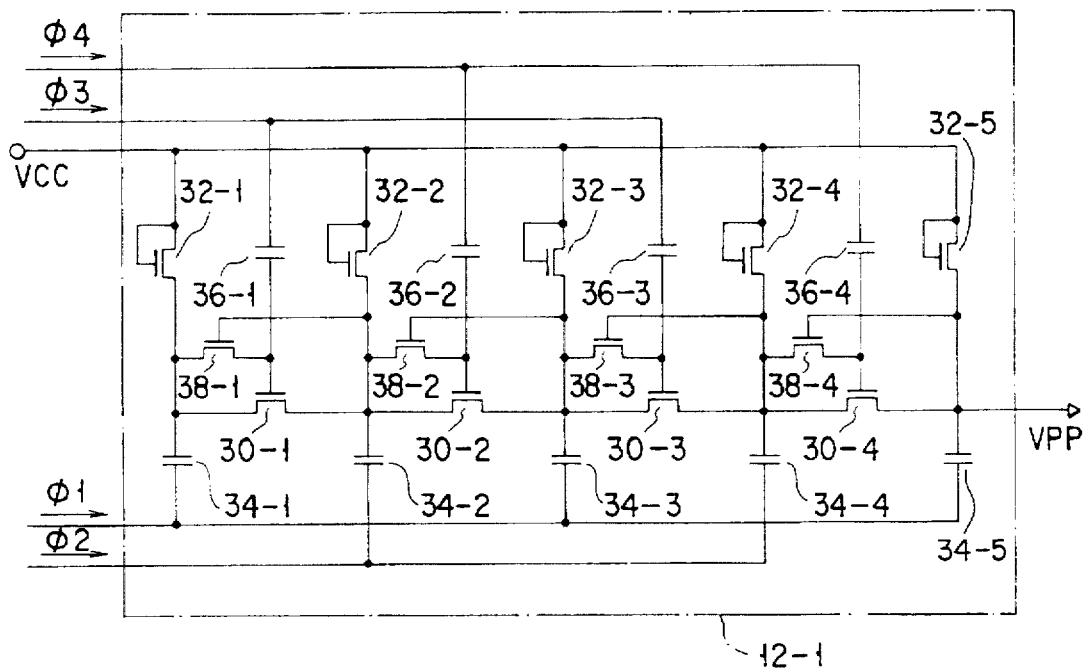
FIG. 10 is a circuit diagram of the charge pump circuit shown in FIG. 5.

FIG. 10 is a circuit diagram showing one example of the charge pump circuit driven by 4-phase pulses. The charge pump circuit 12-1 shown in FIG. 10 is designed to prevent occurrence of the voltage drop corresponding to the threshold voltage of a MOSFET in the voltage raising operation.

In FIG. 10, reference numerals 30-1 to 30-4 and 32-1 to 32-5 denote NMOS transistors, VCC denotes a power source voltage, and VPP denotes an output voltage. Further, reference numerals 34-1 to 34-5 and 36-1 to 36-4 denote capacitors.

In the charge pump circuit 12-1 shown in FIG. 10, NMOS transistors 38-1 to 38-4 are additionally provided and it is driven by 4-phase pulse signals φ1 to φ4 as shown in FIG. 8, and as a result, an output voltage of preset value can be obtained even if the power source voltage VCC is lowered to some extent.

The 4-phase pulse signals φ1 to φ4 are generated such that the first pulse signal φ1 and the second pulse signal φ2 are deviated from each other by half the period and the third pulse signal φ3 and the fourth pulse signal φ4 are deviated from each other by half the period and the pulse signals are input to every other transfer stage of the charge pump circuit 12-1. By using the above operation timing, the transfer efficiency of the charge pump circuit is enhanced and the voltage raising time can be reduced.

Further, in this type of charge pump circuit, it is preferable that the "H" level of the first pulse signal φ1 will not overlap the "H" level of the fourth pulse signal φ4. Likewise, it is preferable that the "H" level of the second pulse signal φ2 will not overlap the "H" level of the third pulse signal φ3.

In this respect, in this embodiment, even if the period of the basic pulse Q0 and Q1 generated by the oscillator 14-1 is varied by various types of dependencies, the pulse signals will not overlap each other as described above even if the condition varies, and thus normal pulse signals can be always derived.

Next, a semiconductor circuit device according to a second embodiment of this invention is explained.

Figure 11:
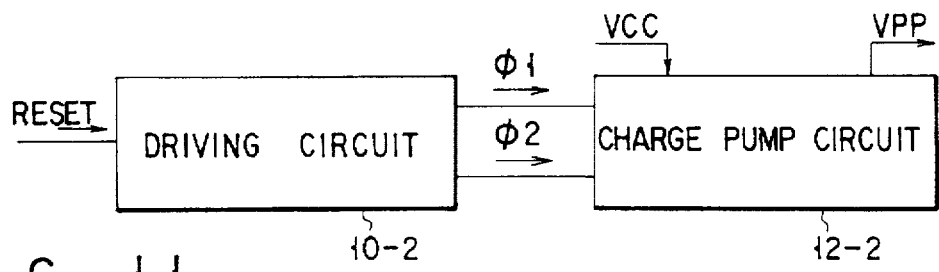
FIG. 11 is a schematic block diagram showing a semiconductor circuit device including a charge pump circuit and a driving circuit thereof according to a second embodiment of this invention.
Figure 12:
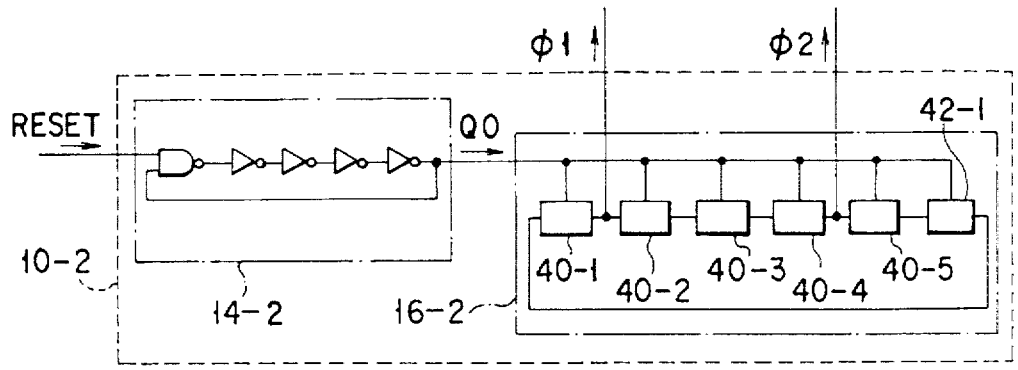
FIG. 12 is a circuit diagram showing the driving circuit of FIG. 11.

FIG. 11 is a block diagram showing the schematic construction of a semiconductor circuit device according to the second embodiment of this invention, and FIG. 12 is a circuit diagram showing the construction of a driving circuit of FIG. 11.

As shown in FIG. 11, a driving circuit 10-2 is supplied with a reset signal RESET for permitting the initializing operation. The driving circuit 10-2 outputs 2-phase pulse signals φ1, φ2 in response to the reset signal RESET. The pulse signals φ1, φ2 are input to a charge pump circuit 12-2. The charge pump circuit 12-2 generates a voltage VPP which is higher than a power source voltage VCC from the power source voltage VCC in response to the pulse signals φ1, φ2.

Next, the driving circuit 10-2 is explained.

As shown in FIG. 12, the driving circuit 10-2 includes a basic pulse oscillator 14-2 and a pulse signal generator 16-2. The generator 16-2 is constructed by a plurality of gate circuits 40-1 to 40-5 and a gate circuit 42-1 which are serially connected and the output terminal of the gate circuit 42-1 is connected to the input terminal of the gate circuit 40-1 so as to constitute a counter circuit.

The basic pulse Q0 may be supplied from an exterior circuit.

The basic pulse Q0 is supplied to each gate of the gate circuits 40-1 to 40-5 and 42-1. The first pulse signal φ1 is derived from a connection node between the output terminal of the gate circuit 40-1 and the input terminal of the gate circuit 40-2 and the second pulse signal φ2 is derived from a connection node between the output terminal of the gate circuit 40-4 and the input terminal of the gate circuit 40-5.

Figure 13A:
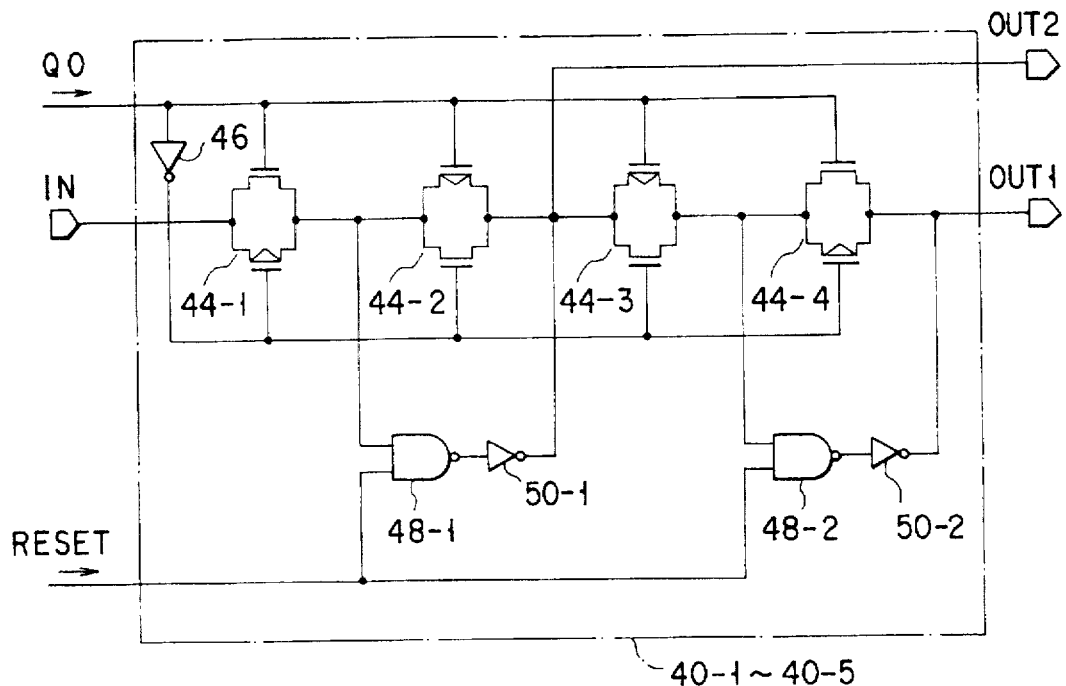
FIGS. 13A and 13B are circuit diagrams showing gate circuits of FIG. 12.
Figure 13B:
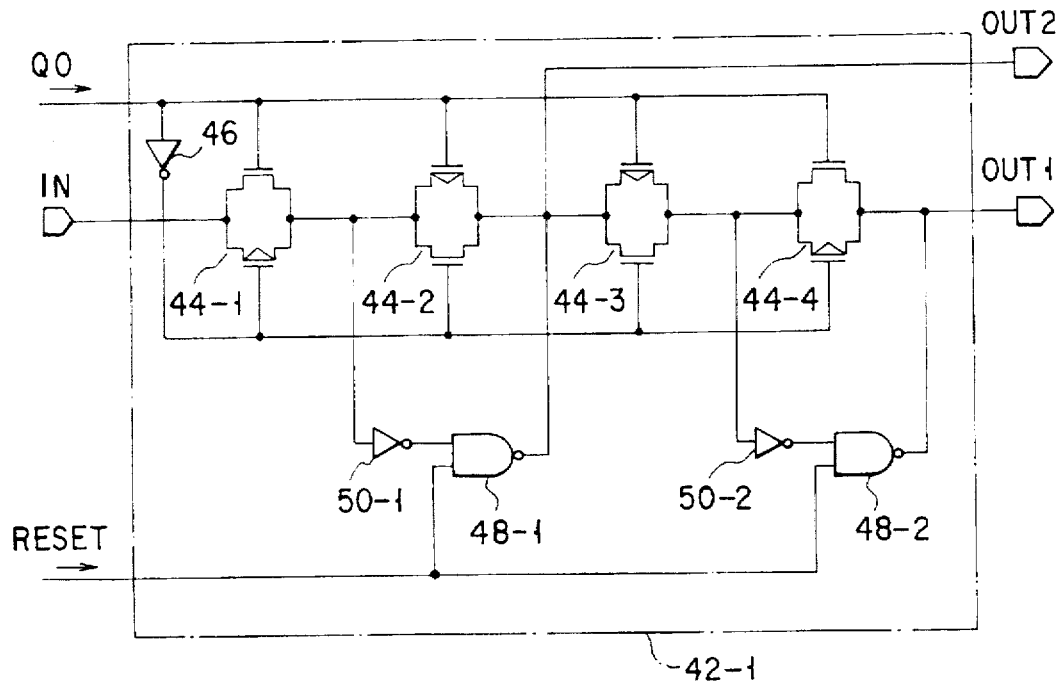

FIG. 13A is a circuit diagram of the gate circuits 40-1 to 40-5 shown in FIG. 12 and FIG. 13B is a circuit diagram of the gate circuit 42-1 shown in FIG. 12.

As shown in FIG. 13A, each of the gate circuits 40-1 to 40-5 includes a preset number of transfer gates 44-1 to 44-4 which are each formed of an NMOS transistor and a PMOS transistor and are series-connected between the input node and the output node thereof. The basic pulse Q0 is supplied to the gate of the NMOS transistor of the transfer gate 44-1, the gate of the PMOS transistor of the transfer gate 44-2, the gate of the PMOS transistor of the transfer gate 44-3, and the gate of the NMOS transistor of the transfer gate 44-4. Further, the basic pulse Q0 is supplied to the gate of the PMOS transistor of the transfer gate 44-1, the gate of the NMOS transistor of the transfer gate 44-2, the gate of the NMOS transistor of the transfer gate 44-3, and the gate of the PMOS transistor of the transfer gate 44-4 via an inverter 46.

A first output signal OUT1 is derived from the output terminal of the transfer gate 44-4 and a second output signal OUT2 is derived from the output terminal of the transfer gate 44-2.

With the above construction, when a pulse-like input signal IN is input, a pulse-like first output signal OUT1 which is delayed by half the period and a pulse-like second output signal OUT2 which is delayed by one period can be obtained.

The pulse widths (periods of "H" level) of the pulse-like input signal IN and output signals OUT1, OUT2 are set equal to one period of the basic pulse Q0.

A circuit constructed by a NAND gate 48-1 and an inverter 50-1 and a circuit constructed by a NAND gate 48-2 and an inverter 50-2 constitute a circuit for permitting the initializing operation of the gate circuits 40-1 to 40-5, and a reset signal RESET is supplied to the circuit.

The gate circuit 42-1 shown in FIG. 13B is basically the same as the gate circuit 40-1 to 40-5. The difference lies in the connection state of a circuit constructed by the NAND gate 48-1 and the inverter 50-1 and a circuit constructed by the NAND gate 48-2 and the inverter 50-2. That is, the construction of the circuit for permitting the initializing operation is different.

In the generator shown in FIG. 12, an output of each of the gate circuits 40-1 to 40-5 and 42-1 is the first output OUT1 and supplied to the next stage gate circuit. The second output OUT2 is not used in this example.

Next, the operation of the pulse signal generator 16-2 shown in FIG. 12 is explained.

Figure 14:
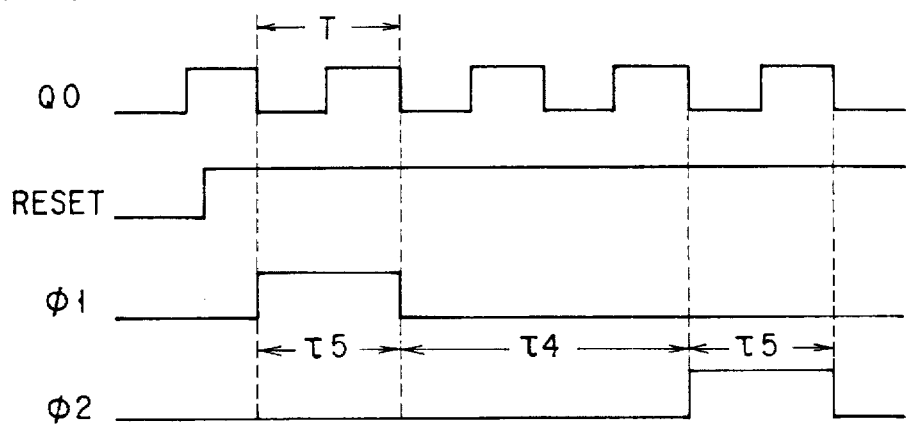
FIG. 14 is a waveform diagram showing an input waveform and output waveforms of a pulse signal generator of FIG. 12.

FIG. 14 is a waveform diagram showing an input waveform and output waveforms of the pulse signal generator 16-2 of FIG. 12.

The period τ4 shown in FIG. 14 indicates a period from the fall of the first pulse signal φ1 to the rise of the second pulse signal φ2 and a period (not shown) from the fall of the second pulse signal φ2 to the rise of the first pulse signal.

The period τ5 indicates a period in which the first pulse signal φ1 or second pulse φ2 is set at the "H" level.

With the construction of the generator 16-2 shown in FIG. 12, the operation timing ratio is set as indicated by the following equation (2).

$$\tau4:\tau5=2:1 \qquad (2)$$

Also, in the second embodiment, the relation of τ4:τ5=2:1 can be maintained even if the period T of the basic pulse Q0 is changed as in the case of the first embodiment.

Thus, like the first embodiment, even if the period of the basic pulse Q0 is varied by the dependency on the power source voltage VCC, the transistor threshold voltage and the temperature variation, the first pulse signal φ1 and the second pulse signal φ2 will not overlap each other and pulse signals which are always set in the matching state can be obtained.

Next, the charge pump circuit is explained.

Figure 15:
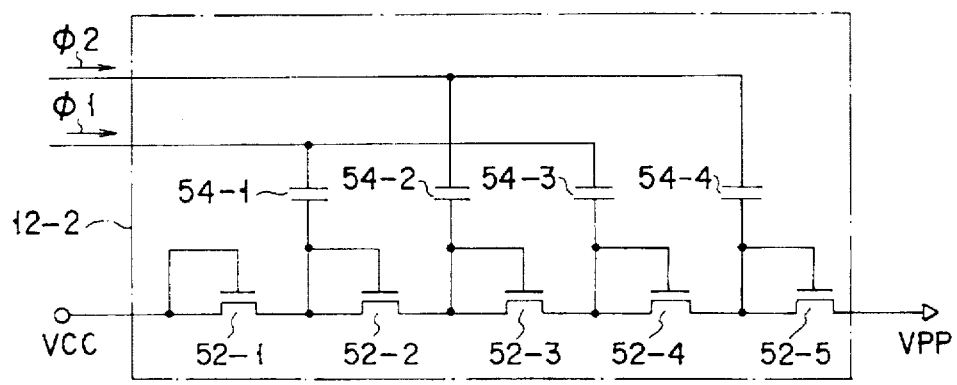
FIG. 15 is a circuit diagram of the charge pump circuit shown in FIG. 11.

FIG. 15 is a circuit diagram showing one example of the charge pump circuit driven by a 2-phase pulse.

In FIG. 15, reference numerals 52-1 to 52-5 denote NMOS transistors, a reference symbol VCC denotes a power source voltage, and a reference symbol VPP denotes an output voltage. Further, reference numerals 54-1 to 54-5 denote capacitors.

In the charge pump circuit 12-2 shown in FIG. 15, a positive voltage VPP which is higher than the power source voltage VCC generated from the power source voltage VCC by driving the NMOS transistors 52-2, 52-4 by the first pulse signal φ1 and driving the NMOS transistors 52-3, 52-5 by the second pulse signal φ2.

Next, a semiconductor circuit device according to the third embodiment of this invention is explained.

In the third embodiment, the charge pump circuit is driven to generate a negative voltage VBB which is lower than the ground potential VSS. One example of the above charge pump circuit for lowering the voltage is shown in FIG. 22. The charge pump circuit shown in FIG. 22 is used in a self sub-bias circuit, for example.

FIG. 16 is a block diagram showing the schematic construction of a semiconductor circuit device according to the third embodiment of this invention, and FIG. 17 is a block diagram showing the basic construction of a driving circuit of FIG. 16.

As shown in FIG. 16, a reset signal RESET for permitting the initializing operation and an input pulse CLK are input to a driving circuit 10-3. The driving circuit 10-3 outputs 6-phase pulse signals φ1 to φ6 in response to the reset signal RESET and input pulse CLK. The pulse signals φ1 to φ6 are input to a charge pump circuit 12-3. The charge pump circuit 12-3 generates a negative voltage VBB from the ground potential VSS in response to the pulse signals φ1 to φ6.

In the device of the third embodiment, the input pulse CLK is supplied from the exterior of the driving circuit 10-3. In this case, the input pulse CLK can be replaced by an internal clock or the like created for measuring the operation timing of the memory device, for example. Further, the input pulse CLK may be independently created in the driving circuit by additionally providing a new oscillator in the driving circuit as in the first or second embodiment.

Next, the driving circuit 10-3 is explained.

As shown in FIG. 17, the driving circuit 10-3 includes a basic pulse oscillator 14-3 and a pulse signal generator 16-3.

Next, the oscillator 14-3 is explained.

FIG. 18 is a circuit diagram showing the oscillator of FIG. 17.

As shown in FIG. 18, the oscillator 14-3 includes gate circuits 40-6 to 40-12 which are serially connected and the output terminal of the gate circuit 42-2 is connected to the input terminal of the gate circuit 40-6. With this connection, the oscillator 14-3 constitutes a counter circuit.

The circuit construction of the gate circuits 40-6 to 40-14 is the same as that of the gate circuit shown in FIG. 13A and the circuit construction of the gate circuit 42-2 is the same as that of the gate circuit shown in FIG. 13B.

The input pulse CLK is supplied to the gates of the gate circuits 40-6 to 40-14 and 42-2. The first basic pulse Q0 is derived from the second output terminal OUT2 of the gate circuit 40-6 and the second basic pulse Q1 is derived from a connection node (first output terminal OUT1 of the gate circuit 40-6) between the output terminal of the gate circuit 40-6 and the input terminal of the gate circuit 40-7. Likewise, the third basic pulse Q2 is derived from the second output terminal OUT2 of the gate circuit 40-7, the fourth basic pulse Q3 is derived from the first output terminal OUT1 of the gate circuit 40-7, the fifth basic pulse Q4 is derived from the second output terminal OUT2 of the gate circuit 40-8, the sixth basic pulse Q5 is derived from the first output terminal OUT1 of the gate circuit 40-8, - - - , the nineteenth basic pulse Q18 is derived from the second output terminal OUT2 of the gate circuit 42-2, and the twentieth basic pulse Q19 is derived from the first output terminal OUT1 of the gate circuit 42-2.

Next, the operation of the oscillator shown in FIG. 18 is explained.

Figure 19:
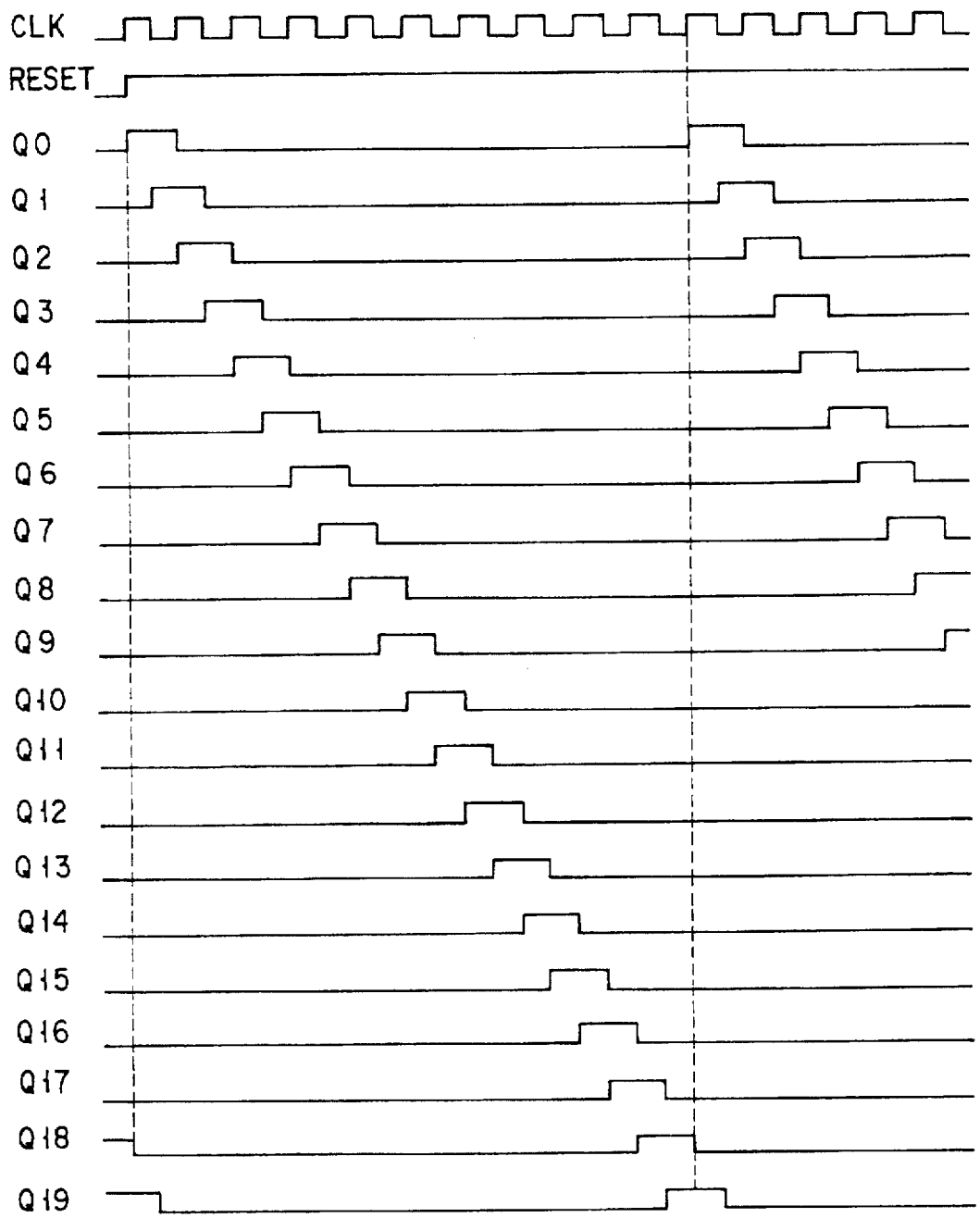
FIG. 19 is a waveform diagram showing an input waveform and output waveforms of the basic pulse oscillator of FIG. 18.

FIG. 19 is a waveform diagram showing an input waveform and output waveforms of the oscillator 14-3 of FIG. 18.

As shown in FIG. 19, the oscillator 14-3 generates the basic pulses Q0 to Q19 with delay time of half the period set therebetween in response to the input pulse CLK.

Next, the generator 16-3 is explained.

Figure 20:
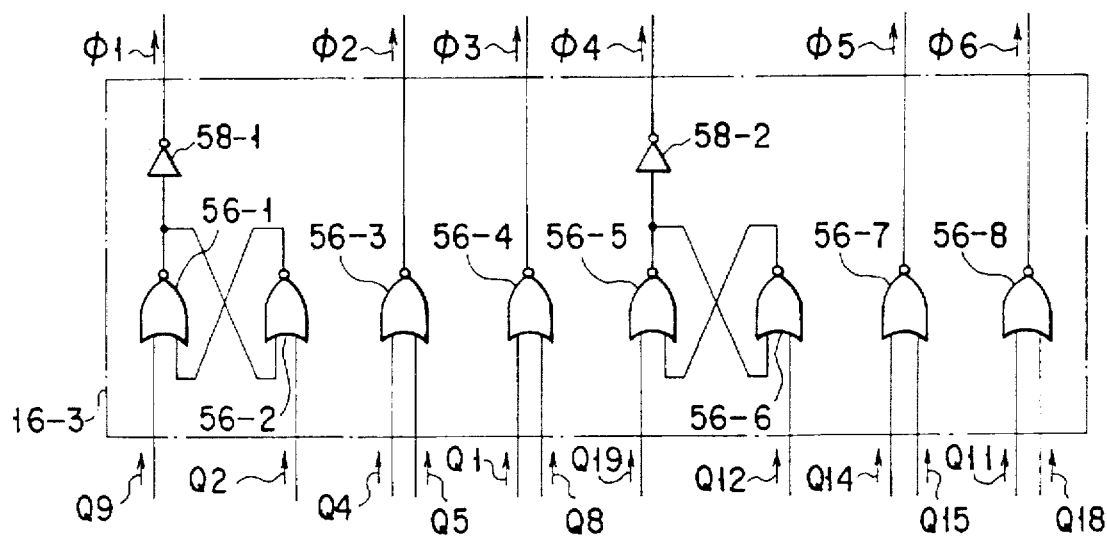
FIG. 20 is a circuit diagram of a pulse signal generator shown in FIG. 17.

FIG. 20 is a circuit diagram of the generator 16-3 shown in FIG. 17.

As shown in FIG. 20, the generator 16-3 receives twelve basic pulses Q1, Q2, Q4, Q5, Q8, Q9, Q11, Q12, Q14, Q15, Q18 and Q19 among the basic pulses Q0 to Q19 generated from the oscillator 14-3.

First, the tenth basic pulse Q9 is input to the first input terminal of a first NOR gate 56-1. The third basic pulse Q2 is input to the first input terminal of a second NOR gate 56-2. The output terminal of the second NOR gate 56-2 is connected to the second input terminal of the first NOR gate 56-1. The output terminal of the first NOR gate 56-1 is connected to the second input terminal of the second NOR gate 56-2 and the input terminal of a first inverter 58-1. An output of the first inverter 58-1 is used as the first pulse signal $\phi 1$.

The fifth basic pulse Q4 is input to the first input terminal of a third NOR gate 56-3. The sixth basic pulse Q5 is input to the second input terminal of a third NOR gate 56-3 and an output of the third NOR gate 56-3 is used as the second pulse signal $\phi 2$.

The second basic pulse Q1 is input to the first input terminal of a fourth NOR gate 56-4. The ninth basic pulse Q8 is input to the second input terminal of the fourth NOR gate 56-4 and an output of the fourth NOR gate 56-4 is used as the third pulse signal $\phi 3$.

The twentieth basic pulse Q19 is input to the first input terminal of a fifth NOR gate 56-5. The thirteenth basic pulse Q12 is input to the first input terminal of a sixth NOR gate 56-6. The output terminal of the sixth NOR gate 56-6 is connected to the second input terminal of the fifth NOR gate 56-5. The output terminal of the fifth NOR gate 56-5 is connected to the second input terminal of the sixth NOR gate 56-6 and the input terminal of a second inverter 58-2. An output of the second inverter 58-2 is used as the fourth pulse signal $\phi 4$.

The fifteenth basic pulse Q14 is input to the first input terminal of a seventh NOR gate 56-7. The sixteenth basic pulse Q15 is input to the second input terminal of a seventh NOR gate 56-7 and an output of the seventh NOR gate 56-7 is used as the fifth pulse signal $\phi 5$.

The twelfth basic pulse Q11 is input to the first input terminal of an eighth NOR gate 56-8. The nineteenth basic pulse Q18 is input to the second input terminal of an eighth NOR gate 56-8 and an output of the eighth NOR gate 56-8 is used as the sixth pulse signal $\phi 6$.

Next, the operation of the generator shown in FIG. 20 is explained.

Figure 21:
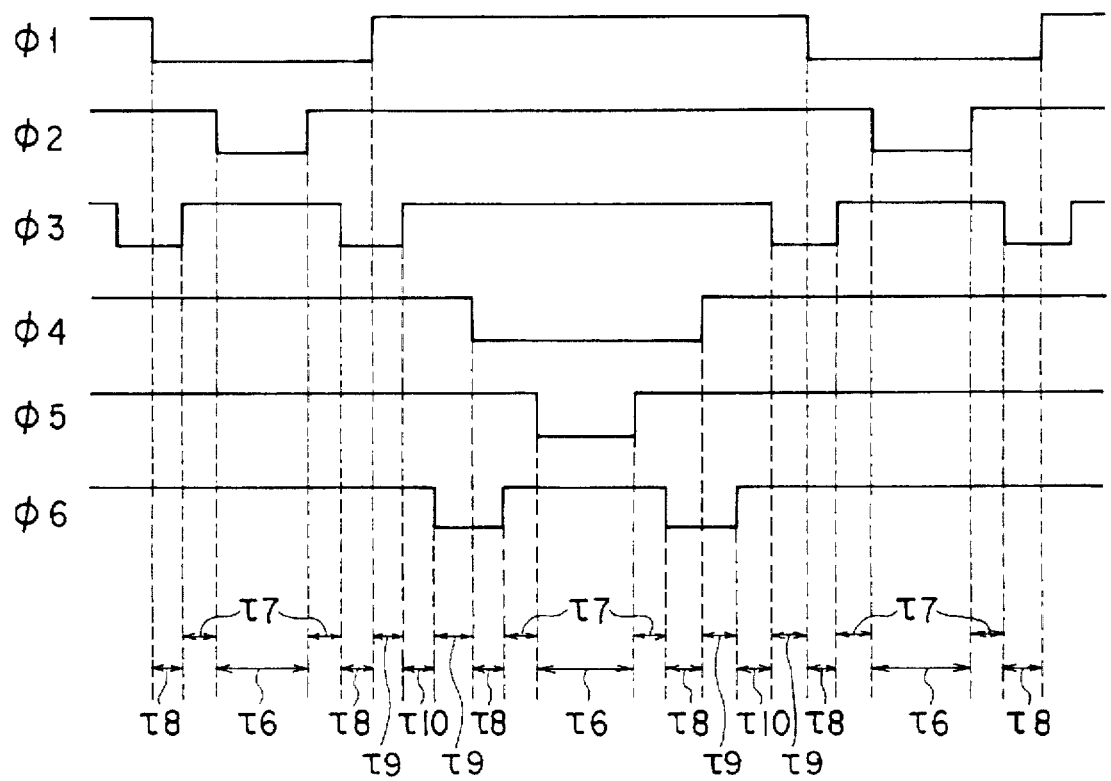
FIG. 21 is a waveform diagram showing output waveforms of the pulse signal generator shown in FIG. 20.

FIG. 21 is a waveform diagram showing output waveforms of the generator 16-3 shown in FIG. 20.

The period $\tau 6$ shown in FIG. 21 indicates a period in which the second pulse $\phi 2$ is set at the "L" level or a period in which the fifth pulse $\phi 5$ is set at the "L" level.

The period $\tau 7$ indicates a period from the rise of the third pulse $\phi 3$ to the fall of the second pulse $\phi 2$ and a period from the rise of the second pulse $\phi 2$ to the fall of the third pulse $\phi 3$. Further, the period $\tau 7$ indicates a period from the rise of the sixth pulse $\phi 6$ to the fall of the fifth pulse $\phi 5$ and a period from the rise of the fifth pulse $\phi 5$ to the fall of the sixth pulse $\phi 6$.

The period $\tau 8$ indicates a period from the fall of the first pulse $\phi 1$ to the rise of the third pulse $\phi 3$ and a period from the fall of the third pulse $\phi 3$ to the rise of the first pulse $\phi 1$. Further, the period $\tau 8$ indicates a period from the fall of the fourth pulse $\phi 4$ to the rise of the sixth pulse $\phi 6$ and a period from the fall of the sixth pulse $\phi 6$ to the rise of the fourth pulse $\phi 4$.

The period $\tau 9$ indicates a period from the rise of the first pulse $\phi 1$ to the rise of the third pulse $\phi 3$ and a period from the fall of the third pulse $\phi 3$ to the fall of the first pulse $\phi 1$. Further, the period $\tau 9$ indicates a period from the fall of the sixth pulse $\phi 6$ to the fall of the fourth pulse $\phi 4$ and a period from the rise of the fourth pulse $\phi 4$ to the rise of the sixth pulse $\phi 6$.

The period $\tau 10$ indicates a period from the rise of the third pulse $\phi 3$ to the fall of the sixth pulse $\phi 6$ and a period from the rise of the sixth pulse $\phi 6$ to the fall of the third pulse $\phi 3$.

Like the first and second embodiments, in the third embodiment, even if the period of the basic pulse is changed, the operation timing ratio shown in FIG. 21 is kept unchanged.

Therefore, the "L" level period of the first pulse signal $\phi 1$ and the "L" level period of the fourth pulse signal $\phi 4$, the "L" level period of the second pulse signal $\phi 2$ and the "L" level period of the third pulse signal $\phi 3$, and the "L" level period of the fifth pulse signal $\phi 5$ and the "L" level period of the sixth pulse signal $\phi 6$ do not overlap each other and pulse signals which are set in the matching state can be obtained.

Next, the charge pump circuit is explained.

FIG. 22 is a circuit diagram showing one example of the charge pump circuit driven by 6-phase pulses. As described above, the charge pump circuit shown in FIG. 16 is used to generate a negative voltage VBB.

In FIG. 22, reference numerals 60-1 to 60-10 denote PMOS transistors, a reference symbol VSS denotes a ground potential, and a reference symbol VBB denotes a negative output voltage. Further, reference numerals 62-1 to 62-6 denote capacitors.

If the ground potential VSS is replaced by the power source voltage VCC, the PMOS transistors 60-1 to 60-10 are all replaced by NMOS transistors, output waveforms of the pulse signals $\phi 1$ to $\phi 6$ shown in FIG. 15 are also inverted (the "H" level periods are all changed to the "L" level periods and the "L" level periods are all changed to the "H" level periods) in the circuit condition shown in FIG. 22, a charge pump circuit capable of generating a positive output voltage VPP which is higher than the power source voltage VCC can be attained.

Next, a semiconductor circuit device according to the fourth embodiment of this invention is explained.

The fourth embodiment is basically similar to the third embodiment and the schematic construction thereof can be expressed in a block form in FIGS. 16 and 17.

First, a basic pulse oscillator is explained.

FIG. 23 is a circuit diagram showing the oscillator. The oscillator 14-4 shown in FIG. 23 can be applied to the block of the oscillator 14-3 shown in FIG. 17.

As shown in FIG. 23, the oscillator 14-4 includes gate circuits 40-15 to 40-18 and 42-3 which are serially connected and the output terminal of the gate circuit 42-3 is connected to the input terminal of the gate circuit 40-15. With this connection, the oscillator 14-4 constitutes a counter circuit.

The circuit construction of each of the gate circuits 40-15 to 40-18 is the same as that of the gate circuit shown in FIG. 13A, and the circuit construction of the gate circuit 42-3 is the same as that of the gate circuit shown in FIG. 13B.

An input pulse CLK is supplied to the gates of the gate circuits 40-15 to 40-18 and 42-3. The first basic pulse Q0 is derived from the second output terminal OUT2 of the gate circuit 40-15 and the second basic pulse Q1 is derived from a connection node (first output terminal OUT1 of the gate circuit 40-15) between the output terminal of the gate circuit 40-15 and the input terminal of the gate circuit 40-16. Likewise, the third basic pulse Q2 is derived from the second output terminal OUT2 of the gate circuit 40-16, the fourth basic pulse Q3 is derived from the first output terminal OUT1 of the gate circuit 40-16, the fifth basic pulse Q4 is derived from the second output terminal OUT2 of the gate circuit 40-17, the sixth basic pulse Q5 is derived from the first output terminal OUT1 of the gate circuit 40-17, ---, the ninth basic pulse Q8 is derived from the second output terminal OUT2 of the gate circuit 42-3, and the tenth basic pulse Q9 is derived from the first output terminal OUT1 of the gate circuit 42-3.

Next, the operation of the oscillator 14-4 shown in FIG. 23 is explained.

Figure 24:
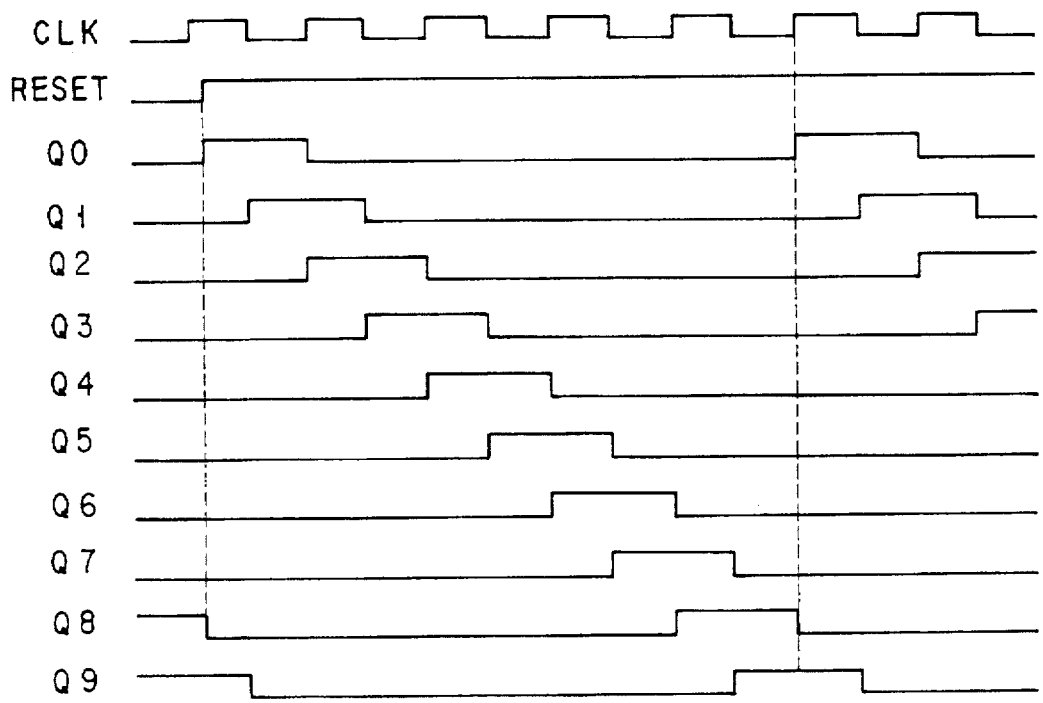
FIG. 24 is a waveform diagram showing an input waveform and output waveforms of the basic pulse oscillator of FIG. 23.

FIG. 24 is a waveform diagram showing an input waveform and output waveforms of the oscillator 14-4 of FIG. 23.

As shown in FIG. 24, the oscillator 14-4 generates the basic pulses Q0 to Q9 with delay time of half the period set therebetween in response to the input pulse CLK.

Next, the pulse signal generator is explained.

Figure 25:
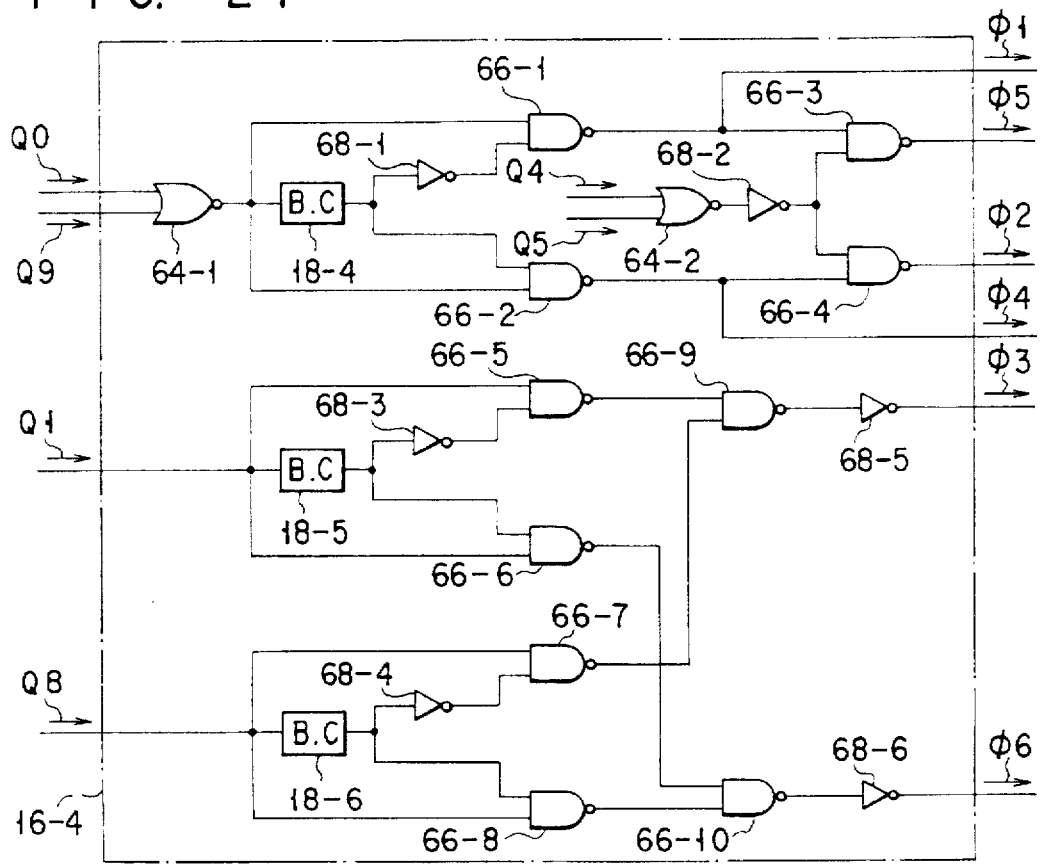
FIG. 25 is a circuit diagram showing a pulse signal generator contained in a semiconductor circuit device according to the fourth embodiment of this invention.

FIG. 25 is a circuit diagram showing the generator. The generator 16-4 shown in FIG. 25 can be applied to the block of the generator 16-3 shown in FIG. 17.

As shown in FIG. 25, the generator 16-4 is supplied with the six basic pulses Q0, Q1, Q4, Q5, Q8 and Q9 among the basic pulses Q0 to Q9 generated from the oscillator 14-4.

First, the first basic pulse Q0 is input to the first input terminal of a first NOR gate 64-1. The tenth basic pulse Q9 is input to the second input terminal of the first NOR gate 64-1. The output terminal of the first NOR gate 64-1 is connected to the first input terminal of a first NAND gate 66-1, the input terminal of a first binary counter 18-4 and the first input terminal of a second NAND gate 66-2. The output terminal of the first binary counter 18-4 is connected to the input terminal of the first inverter 68-1 and the second input terminal of the second NAND gate 66-2. The output of the first inverter 68-1 is connected to the second input terminal of the first NAND gate 66-1. An output of the first NAND gate 66-1 is used as the first pulse signal φ1 and the output terminal thereof is connected to the first input terminal of a third NAND gate 66-3. Further, an output of the second NAND gate 66-2 is used as the fourth pulse signal φ4 and the output terminal thereof is connected to the first input terminal of a fourth NAND gate 66-4.

The fifth basic pulse Q4 is input to the first input terminal of a second NOR gate 64-2. The sixth basic pulse Q5 is input to the second input terminal of the second NOR gate 64-2. The output terminal of the second NOR gate 64-2 is connected to the input terminal of the second inverter 68-2. The output terminal of the second inverter 68-2 is connected to the second input terminal of the third NAND gate 66-3 and the second input terminal of the fourth NAND gate 66-4. An output of the third NAND gate 66-3 is used as the fifth pulse signal φ5. An output of the fourth NAND gate 66-4 is used as the second pulse signal φ2.

The second basic pulse Q1 is supplied to the first input terminal of a fifth NAND gate 66-5, the input terminal of the second binary counter 18-5 and the first input terminal of a sixth NAND gate 66-6. The output terminal of the second binary counter 18-5 is connected to the input terminal of a third inverter 68-3 and the second input terminal of the sixth NAND gate 66-6. The output terminal of the third inverter 68-3 is connected to the second input terminal of the fifth NAND gate 66-5.

The ninth basic pulse Q8 is supplied to the first input terminal of a seventh NAND gate 66-7, the input terminal of the third binary counter 18-6 and the first input terminal of an eighth NAND gate 66-8. The output terminal of the third binary counter 18-6 is connected to the input terminal of a fourth inverter 68-4 and the second input terminal of the eighth NAND gate 66-8. The output terminal of the fourth inverter 68-4 is connected to the second input terminal of the seventh NAND gate 66-7.

The output terminal of the fifth NAND gate 66-5 is connected to the first input terminal of a ninth NAND gate 66-9. The output terminal of the sixth NAND gate 66-6 is connected to the first input terminal of a tenth NAND gate 66-10. The output terminal of the seventh NAND gate 66-7 is connected to the second input terminal of the ninth NAND gate 66-9. The output terminal of the eighth NAND gate 66-8 is connected to the second input terminal of the tenth NAND gate 66-10.

The output terminal of the ninth NAND gate 66-9 is connected to the input terminal of a fifth inverter 68-5. An output of the fifth inverter 68-5 is used as the third pulse signal φ3. The output terminal of the tenth NAND gate 66-10 is connected to the input terminal of a sixth inverter 68-6. An output of the sixth inverter 68-6 is used as the sixth pulse signal φ6.

The circuit construction of the binary counters 18-4 to 18-6 is the same as that of the binary counter shown in FIG. 7.

Next, the operation of the generator shown in FIG. 25 is explained.

The output waveform of the generator 16-4 shown in FIG. 25 is basically the same as that of the generator 16-3 shown in FIG. 20 and the schematic output waveform can be expressed as shown in FIG. 21.

Like the first to third embodiments, in the fourth embodiment, even if the period of the basic pulse is changed, the operation timing ratio shown in FIG. 21 is kept unchanged.

Therefore, the first pulse signal φ1 and the fourth pulse signal φ4, the second pulse signal φ2 and the third pulse signal φ3, and the fifth pulse signal φ5 and the sixth pulse signal φ6 do not overlap each other and pulse signals which are set in the matching state can be obtained.

Next, a case wherein a semiconductor circuit device according to this invention is used in a dynamic RAM or a nonvolatile semiconductor memory such as an EPROM, EEPROM, block-erasing type EEPROM or NAND type EEPROM is explained.

FIG. 26 is a block diagram showing the schematic construction of a semiconductor memory having a semiconductor circuit device according to this invention fabricated thereon.

As shown in FIG. 26, a driving circuit 10 including a basic pulse oscillator 14 and a pulse signal generator 16 supplies driving pulses φ1 to φn to a charge pump circuit 12. Further, a memory section having a memory cell array 70, column decoder 72 and row decoder 74 as main portions is provided. The charge pump circuit 12 is driven by the pulse signals φ1 to φn and supplies a raised voltage VPP to the row decoder 74, for example.

The block construction of FIG. 26 is only one example, and other various block constructions can be made.

Next, a semiconductor circuit device according to the fifth embodiment of this invention is explained.

FIG. 27 is a block diagram showing the schematic construction of a semiconductor circuit device according to the fifth embodiment of this invention.

As shown in FIG. 27, the semiconductor circuit device according to the fifth embodiment includes a driving circuit 10 which is the same as that explained in the first to fourth embodiments and further includes a detection circuit 76 for detecting the level of the raised voltage VPP and feeding back a detection signal K based on the content of detection to the basic pulse oscillator 14-5.

In this case, the detection signal K has a function of increasing the frequency of the basic pulses Q0 to Qn when the level of the raised voltage VPP is lower than a preset level and lowering the frequency of the basic pulses Q0 to Qn when the level of the raised voltage VPP has reached the preset level.

Next, the oscillator 14-5 is explained.

Figure 28:
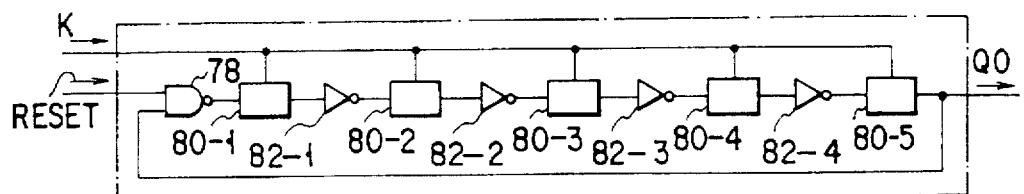
FIG. 28 is a circuit diagram of a basic pulse oscillator of FIG. 27.

FIG. 28 is a circuit diagram of the oscillator shown in FIG. 27.

As shown in FIG. 28, the oscillator 14-5 includes a NAND gate 78 supplied with a reset signal RESET at the first input terminal, and gate circuits 80-1 to 80-5 and inverters 82-1 to 82-4 which are alternately arranged and series-connected between the output terminal of the NAND gate 78 and the second input terminal of the NAND gate 78.

Next, the gate circuits 80-1 to 80-5 are explained.

Figure 29:
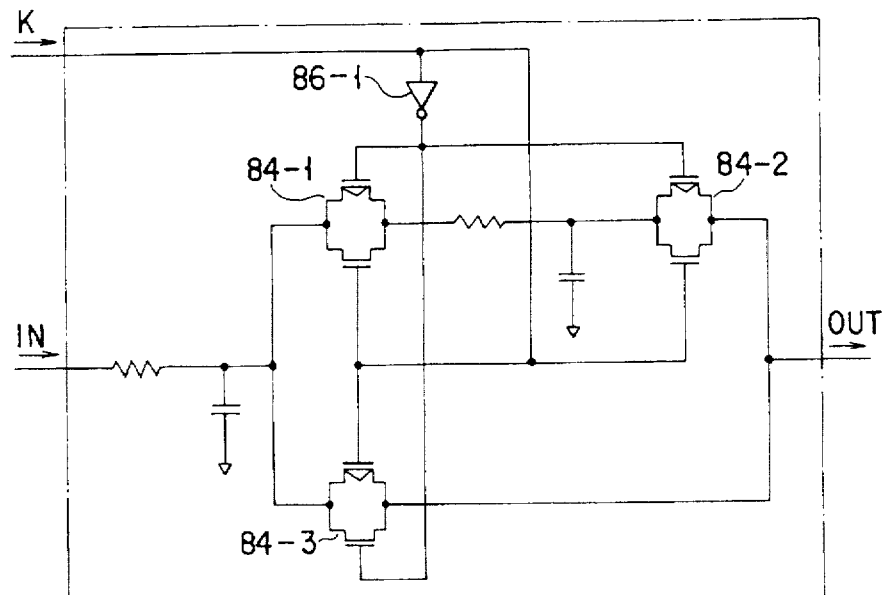
FIG. 29 is a circuit diagram of a gate circuit of FIG. 28.

FIG. 29 is a circuit diagram of each of the gate circuits 80-1 to 80-5 shown in FIG. 28.

As shown in FIG. 29, each of the gate circuits 80-1 to 80-5 includes transfer gates 84-1 to 84-3 each formed of an NMOS transistor and a PMOS transistor. The transfer gate 84-1 is series-connected with the transfer gate 84-2 and the transfer gates 84-1 and 84-2 are serially connected between the input terminal and output terminal of the gate circuit. The transfer gate 84-3 is connected in parallel with a series circuit of the transfer gates 84-1 and 84-2 between the input terminal and output terminal of the gate circuit. A detection signal K is input to the gate of the NMOS transistor of the transfer gate 84-1, the gate of the NMOS transistor of the transfer gate 84-2, the gate of the PMOS transistor of the transfer gate 84-3. Further, the detection signal K is input to the gate of the PMOS transistor of the transfer gate 84-1, the gate of the PMOS transistor of the transfer gate 84-2, the gate of the NMOS transistor of the transfer gate 84-3 via an inverter 86-1.

In the gate circuit 80-1 shown in FIG. 28, the input signal IN thereof is derived as an output of the NAND gate 78 and the output signal OUT thereof is supplied to the inverter 82-1. Likewise, the input signal IN of the gate circuit 80-2 is derived as an output of the inverter 82-1 and the output signal OUT thereof is supplied to the inverter 82-2; ---; and the input signal IN of the gate circuit 80-5 is derived as an output of the inverter 82-4 and the output signal OUT thereof is used as the basic pulse Q0 and supplied to the second input terminal of the NAND gate 78.

In the oscillator 14-5 of the above construction, since the transfer gate 84-3 is made conductive when the detection signal K is set at the "L" level, the basic pulse Q0 is generated in a short period (at a high frequency), and since the transfer gates 84-1 and 84-2 are made conductive when the detection signal K is set at the "H" level, the basic pulse Q0 is generated in a long period (at a low frequency).

Next, the detection circuit 76 is explained.

Figure 30:
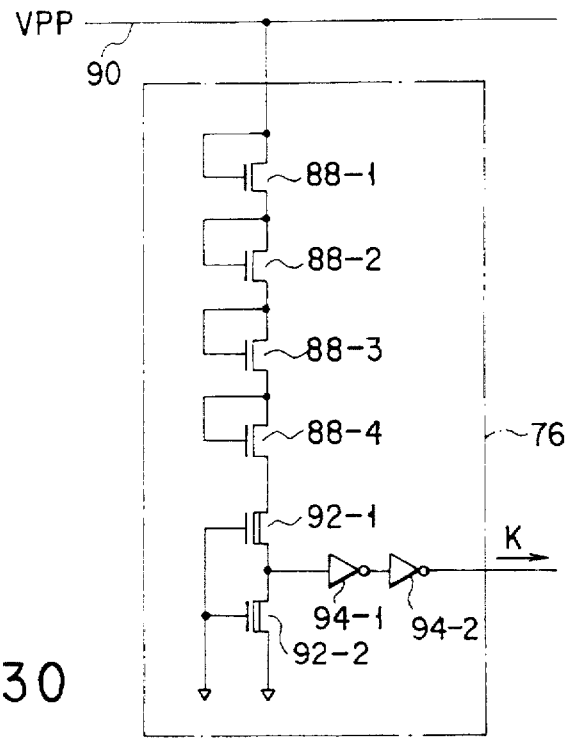
FIG. 30 is a circuit diagram of a detection circuit of FIG.

FIG. 30 is a circuit diagram of the detection circuit 76 shown in FIG. 27.

As shown in FIG. 30, NMOS transistors 88-1 to 88-4 having the drain and gate short-circuited to each other are serially connected and the drain of the NMOS transistor 88-1 which is one end of the series circuit of the NMOS transistors is connected to a raised voltage line 90 to which a voltage VPP is applied. Further, the source of the NMOS transistor 88-4 which is the other end of the series circuit is connected to the drain of a depletion type NMOS transistor 92-1. The source of the NMOS transistor 92-1 is connected to the drain of a depletion type NMOS transistor 92-2. A connection node between the NMOS transistors 92-1 and 92-2 is connected to the input terminal of an inverter 94-1 and the output terminal thereof is connected to the input terminal of an inverter 94-2. An output of the inverter 94-2 is used as the detection signal K.

In the detection circuit 76 of the above construction, when the potential of the raised voltage line 90 is set to a preset potential level, a detection signal K of "L" level is output. As a result, the oscillator 14-5 generates the basic pulse Q0 in a short period (at a high frequency).

When the potential of the raised voltage line 90 has reached the preset potential level, the detection circuit 76 outputs a detection signal K of "H" level. Then, the oscillator 14-5 generates the basic pulse Q0 in a long period (at a low frequency).

Next, a semiconductor circuit device according to the fifth embodiment is explained.

Figure 31A:
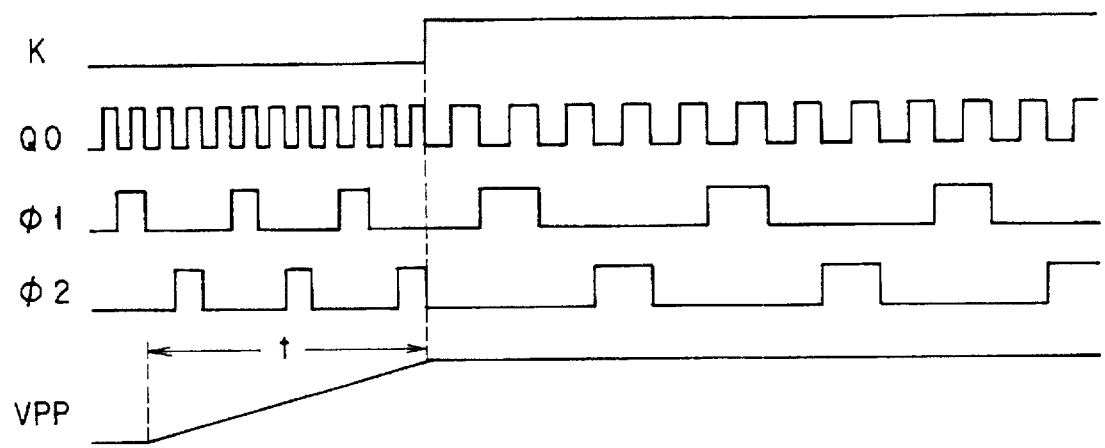
FIG. 31A is a waveform diagram showing an input waveform and output waveforms of the basic pulse oscillator of FIG. 27.

FIG. 31A is a waveform diagram showing an input waveform and output waveforms of a driving circuit contained in the semiconductor circuit device according to the fifth embodiment.

As shown in FIG. 31A, the basic pulse Q0 is output at a high frequency when the detection signal K is set at the "L" level. While the basic pulse Q0 of high frequency is generated, the pulse signals φ1, φ2 are output at a high frequency and the charge pump circuit is driven by the high frequency pulse signals.

When the output voltage VPP of the charge pump circuit has reached a preset potential level, the detection signal K is set to the "H" level and the frequency of the basic pulse Q0 is lowered. While the frequency of the basic pulse Q0 is kept low, the pulse signals φ1, φ2 are output at a low frequency and the charge pump circuit is driven by the low frequency pulse signals.

As described above, in the semiconductor circuit device according to this invention, since the operation timing ratio of the pulse signals φ1, φ2 is kept unchanged even if the frequency of the basic pulse Q0 is changed, the charge pump circuit can be prevented from being erroneously operated in a period in which the basic pulse Q0 of high or low frequency is generated.

The advantage obtained by increasing the frequency of the basic pulse Q0 and increasing the frequency of the driving pulse signals φ1, φ2 is that the voltage raising ability of the charge pump circuit can be enhanced. That is, time t required for the output voltage VPP to reach a preset potential level can be reduced and the operation speed of the device can be enhanced by driving the charge pump circuit by the high frequency pulse signals.

Further, the advantage obtained by lowering the frequency of the basic pulse Q0 and lowering the frequency of the pulse signals φ1, φ2 after the output voltage VPP has reached the preset potential level is that the power consumption can be reduced.

Thus, an increase in the operation speed and a reduction in the power consumption can be simultaneously attained by adequately adjusting the frequency of the pulse signals φ1, φ2 at the above-described timings.

Figure 31B:
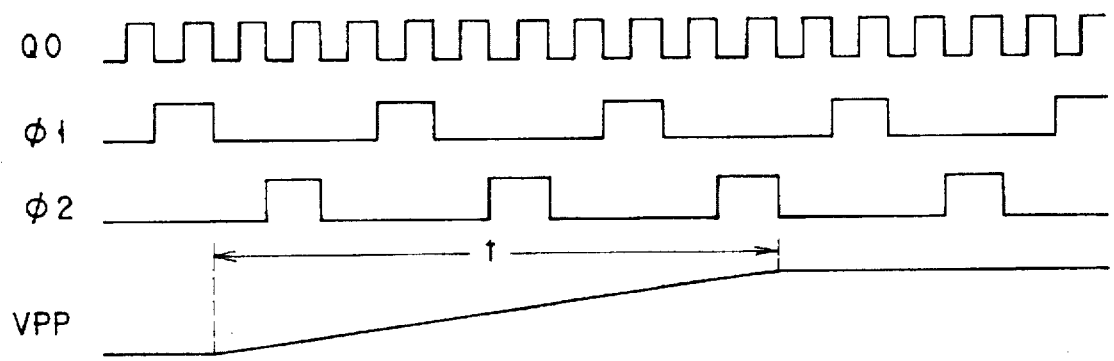
FIG. 31B is a waveform diagram showing an input waveform and output waveforms of the basic pulse oscillator of FIG. 27 in a case wherein the period of an input pulse is not exceeded.

A waveform diagram obtained in a case wherein the frequency of the pulse signals φ1, φ2 is not changed is shown in FIG. 31B as a comparison diagram.

According to this invention explained in the above embodiments, a plurality of pulse signals φ1 to φn for driving the charge pump circuit 12 are created by the driving circuit 10 using the counter circuit.

For example, in the circuit device explained in the first and second embodiments, counter circuits are used in the pulse signal generators 16-1 and 16-2. The generators 16-1 and 16-2 count the basic pulse Q0 generated from the basic pulse oscillator 14 and logically processing the signals obtained by counting so as to derive the pulse signals φ1 to φn. Therefore, even if the frequency of the basic pulse Q0 is changed, the operation timing of the pulse signals φ1 to φn can always be kept at a constant ratio.

Further, since the pulse signals φ1 to φn are obtained by counting the basic pulse Q0 generated from the oscillator 14, even if the period of the basic pulse Q0 is varied by the dependency on the power source voltage, temperature and process variations in the circuit elements at the time of formation of the semiconductor device, the problem that the matching between the pulse signals φ1, φn is lost and the charge pump circuit cannot be correctly operated can be solved.

For example, in the circuit device described in the third embodiment, the counter circuit is used in the basic pulse oscillator 14-3 supplied with the input pulse CLK. Also, in this case, the same effect as that described above can be attained.

Further, for example, in the circuit device described in the fourth embodiment, the counter circuits are used in the basic pulse oscillator 14-4 and the pulse signal generator 16-4. Also, in this case, the same effect as that described above can be attained.

Further, since no error occurs in the operation of the circuit device explained in the first to fourth embodiments even if the frequencies of the basic pulses Q0 to Qn and the input pulse CLK are changed, it is possible to detect the level of an output voltage as in the fifth embodiment, for example, and change the frequency of the pulse signals φ1 to φn generated from the driving circuit 10-5 according to the detected output voltage level.

In the circuit device explained in the fifth embodiment, an increase in the operation speed and a reduction in the power consumption can be simultaneously attained by changing the frequency of the pulse signals φ1 to φn generated from the driving circuit 10-5 according to the detected output voltage level.

As described above, according to this invention, a semiconductor circuit device having a circuit capable of generating a normal pulse signal even if the condition is changed and a pulse creating method can be provided.

A semiconductor circuit device which is the sixth embodiment of the present invention will be described, with reference to FIGS. 32 to 37.

The sixth embodiment is basically similar to the first embodiment.

Figure 32:
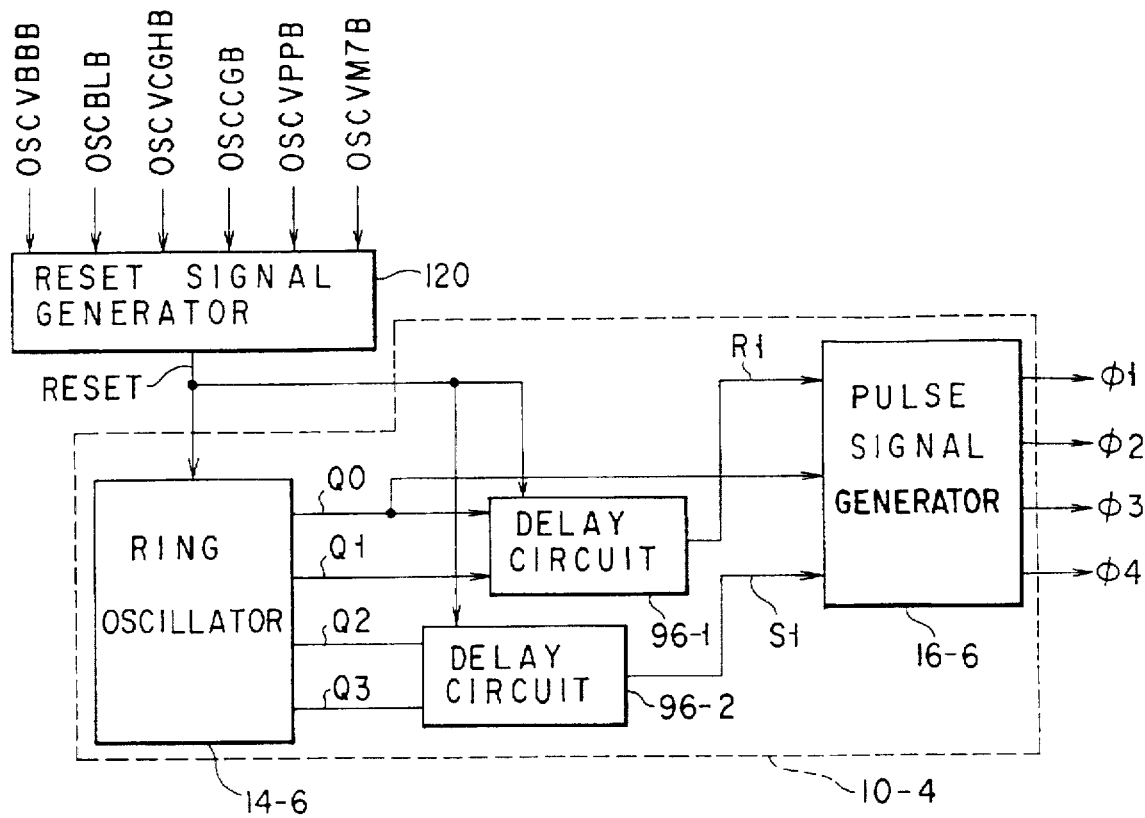
FIG. 32 is a block diagram schematically showing a semiconductor circuit device according to a sixth embodiment of the present invention.

As shown in FIG. 32 which is a block diagram, a reset signal generator 120 receives six signals OSCVM7B, OSCVPPB, OSCCGB, OSCVCGHG, OSCBLOB and OSCVBBB and generates a reset signal RESET from these input signals. The reset signal RESET is supplied to a driving circuit 10-4. In response to the reset signal RESET the driving circuit 10-4 generates 4-phase pulse signals φ1 to φ4.

Figure 33:
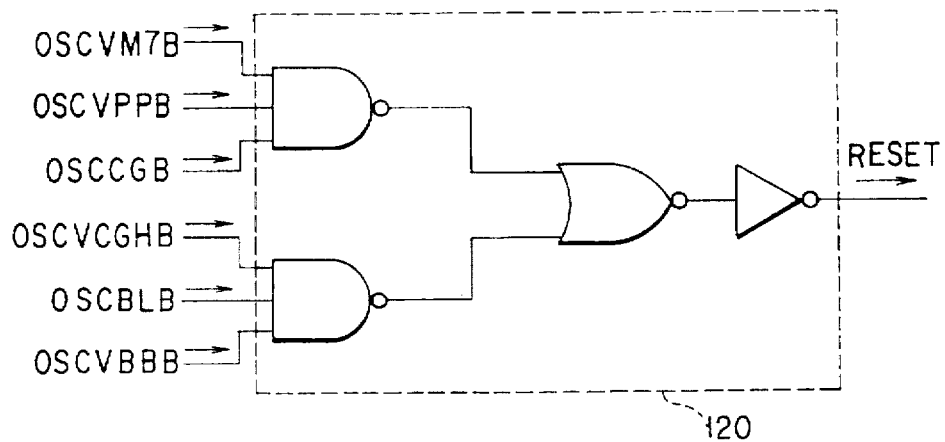
FIG. 33 is a circuit diagram of the reset signal generator incorporated in the device shown in FIG. 32.

As can be understood from FIG. 33 which is a circuit diagram of the reset signal generator 120, the generator 120 may be of such a type hitherto used in a nonvolatile semiconductor memory. In the driving circuit 10-4, the signal RESET is input to a ring oscillator 14-6, a delay circuit 96-1 and a delay circuit 96-2, rendering the oscillator 14-6 and both delay circuits 96-1 and 96-2 active.

The ring oscillator 14-6 has the structure shown in FIG. 34. As shown in FIG. 34, the oscillator 14-6 includes a two-input NAND gate 78. When a signal RESET at high level is supplied to the first input of the NAND gate 78, the oscillator 14-6 generates four basic pulses Q0, Q1, Q2 and Q3.

As shown in FIG. 35 which is a circuit diagram illustrating the delay circuits 96-1 and 96-2, both delay circuits are identical in structure. A similar circuit is incorporated in the driving circuit 10-1 (FIG. 6). The delay circuit 96-1 includes a two-input NAND gate 22-5, and the delay circuit 96-2 includes a two-input NAND gate 22-6. The basic pulses Q0 and Q1 are input to the NAND gate 22-5, whereas the basic pulses Q2 and Q3 are input to the NAND gate 22-6. The delay circuit 96-1 further includes a binary counter 18-7, and the delay circuit 96-2 further includes a binary counter 18-8. The output signal of the NAND gate 22-5 is divided into a signal A and a signal AB (the inversion of the signal A). These signals A and AB are supplied to the binary counter 18-7. The output signal of the NAND gate 22-6 is divided into a inverted-phase signal A and in-phase signal AB, which are supplied to the binary counter 18-8.

The binary counters 18-7 and 18-8 are identical to each other in structure. Hence, only the binary counter 18-7 will be described, with reference to FIG. 36. As is seen from FIG. 36, the binary counter 18-7 is similar to the binary counter 18-1 shown in FIG. 7, but includes a PMOS transistor 200 and an NMOS transistor 202. The gate of the PMOS transistor 200 is connected to receive the reset signal RESET, and the gate of the PMOS transistor 202 is connected to receive a signal obtained by inverting the reset signal RESET.

Upon receipt of a signal RESET at the high level, the PMOS 200 is turned on, applying a VCC-level (high) potential to the input of an inverter 28-7, thereby fixing the output signal R1 (or S1) of the inverter 28-7 at the low level. Upon receipt of a signal at the low level, which an inverter 28-4 has generated by inverting the signal RESET at the high level, the NMOS 202 is turned on, thereby applying a GND-level (low) potential to the input of an inverter 28-5 and ultimately fixing the output signal of the inverter 28-5 at the high level.

On the other hand, when a signal RESET at the low level is supplied to the binary counter 18-7, both the PMOS transistor 200 and the NMOS transistor 202 are turned off. In this case, the binary counter 18-7 is rendered active.

As shown in FIG. 32, the driving circuit 10-4 has a pulse signal generator 16-6. As shown in FIG. 37, the pulse signal generator 16-6 comprises a two-input NOR gate 24-3 and a two-input NAND gate 22-7. The output signal R1 of the delay circuit 96-1 is supplied to the first input of the NOR gate 24-3 and also to the first input of the NAND gate 22-7.

The output signal S1 of the delay circuit 96-2 is supplied to the second input of the NOR gate 24-3 and also to the second input of the NAND gate 22-7. The signal obtained by inverting the output signal of the NOR gate 24-3 is the pulse signal φ1, while the output signal of the NAND gate 22-7 is the pulse signal φ2.

The pulse signal generator 16-6 further comprises a two-input NAND gate 22-8 and a two-input NAND gate 22-9. The pulse signal φ1 is not only output from the circuit 16-6 but also supplied to the first input of the NAND gate 22-8. The pulse signal φ2 is not only output from the circuit 16-6 but also supplied to the first input of the NAND gate 22-9. The basic pulse Q0 output from the oscillator 14-6 is supplied to the second input of the NAND gate 22-8 and also to the second input of the NAND gate 22-9. A signal obtained by inverting the output signal of the NAND gate 22-8 is used as the pulse signal φ3, while a signal obtained by inverting the output signal of the NAND gate 22-9 is used as the pulse signal φ4.

The 4-phase pulse signals φ1 to φ4, thus generated by the pulse signal generator 16-6, are used to drive the charge pump circuit.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor circuit device comprising:
    an oscillator for outputting an oscillating signal;
    a driving signal generator for generating driving signals based on a counting of oscillations of the oscillating signal, the driving signals having phases different from each other and each having a signal edge portion which is synchronous with a signal edge portion of the oscillating signal; and
    a power source potential level shifting circuit, supplied with a first power source potential having a first potential level, for shifting the potential level of the first power source potential from the first potential level to a second potential level which is different from the first potential level and outputting a second power source potential having the second potential level, said power source potential level shifting circuit being driven by the driving signals.

2. The semiconductor circuit device according to claim 1, wherein said driving signal generator generates the driving signals with an operation timing ratio which is constant irrespective of the frequency of the oscillating signal, and drives said power source potential level shifting circuit based on the driving signals.

3. The semiconductor circuit device according to claim 2, wherein said driving generator includes a counter which is supplied with the oscillating signal output by said oscillator.

4. The semiconductor circuit device according to claim 3, wherein said counter includes a plurality of gate circuits each comprising an input gate section and a current path having first and second ends, said gate circuits being connected in series such that the first end of the current path of each gate circuit in said gate circuit series is connected to the second end of the current path of the immediately preceding gate circuit in said gate circuit series, and the second end of the current path of the last gate circuit in said gate circuit series is connected to the first end of the current path of the first gate circuit in said gate circuit series, the input gate section of each gate circuit in said gate circuit series being supplied with the oscillating signal output by said oscillator.

5. The semiconductor circuit device according to claim 4, wherein the driving signals are derived from connection nodes between said gate circuits in said gate circuit series.

6. The semiconductor circuit device according to claim 4, wherein said gate circuits each include a plurality of transfer gates connected in series.

7. The semiconductor circuit device according to claim 6, wherein the driving signals are derived from connection nodes between said gate circuits in said gate circuit series.

8. The semiconductor circuit device according to claim 1, wherein said power source potential level shifting circuit includes a charge pump circuit.

9. The semiconductor circuit device according to claim 1, further comprising changing means for changing the oscillation period of the oscillating signal output by said oscillator according to the second potential level.

10. A semiconductor circuit device comprising:
    an oscillator for outputting an oscillating signal;
    a driving signal generator including counter circuitry for counting oscillations of the oscillating signal output by said oscillator and logic circuitry for logically combining the oscillating signal and outputs of said counter circuitry to generate driving signals having phases different from each other, the driving signals each having a signal edge portion which is synchronous with a signal edge portion of the oscillating signal; and
    a power source potential level shifting circuit; supplied with a first power source potential having a first potential level, for shifting the potential level of the first power source potential from the first potential level to a second potential level which is different from the first potential level and outputting a second power source potential having the second potential level, said power source potential level shifting circuit being driven by the driving signals.

11. The semiconductor circuit device according to claim 10, wherein said driving signal generator generates the driving signals with an operation timing ratio which is constant irrespective of the frequency of the oscillating signal, and drives said power source potential level shifting circuit based on the driving signals.

12. The semiconductor circuit device according to claim 10, wherein said counter circuitry includes a binary counter which is supplied with the oscillating signal output by said oscillator.

13. The semiconductor circuit device according to claim 10, wherein said power source potential level shifting circuit includes a charge pump circuit.

14. A semiconductor circuit device comprising:
    a driving signal generator for generating driving signals based on a counting of oscillations of an oscillating signal supplied thereto, the driving signals each having a signal edge portion which is synchronous with a signal edge portion of the oscillating signal; and
    a circuit driven by said driving signals,
    wherein said circuit includes a power source potential level shifting circuit, supplied with a first power source potential having a first potential level, for shifting the potential level of the first power source potential from the first potential level to a second potential level which is different from the first potential level and outputting a second power source potential having the second potential level, said power source potential level shifting circuit being driven by the driving signals.

15. The semiconductor circuit device according to claim 14, wherein said driving signal generator generates the driving signals with an operation timing ratio which is constant irrespective of the frequency of the oscillating signal, and drives said power source potential level shifting circuit based on the driving signals.

16. The semiconductor circuit device according to claim 15, wherein said driving signal generator includes at least one counter for counting the oscillations of the oscillating signal.

17. The semiconductor circuit device according to claim 16, wherein said power source potential level shifting circuit includes a charge pump circuit.

18. A semiconductor circuit device comprising:
   an oscillator for outputting an oscillating signal; and
   a driving signal generator for generating driving signals based on a counting of oscillations of the oscillating signal, the driving signals each having a signal edge portion which is synchronous with a signal edge portion of the oscillating signal; and
   a circuit driven by said driving signals, wherein said circuit includes a power source potential level shielding circuit, supplied with a first power source potential having a first potential level, for shifting the potential level of the first power source potential from the first potential level to a second potential level which is different from the first potential level and outputting a second power source potential having the second potential level, said power source potential level shifting circuit being driven by the driving signals.

19. The semiconductor circuit device according to claim 18, wherein said driving signal generator generates the driving signals with an operation timing ratio which is constant irrespective of the frequency of the oscillating signal, and drives said power source potential level shifting circuit based on the driving signals.

20. The semiconductor circuit device according to claim 19, wherein said driving signal generator includes at least one counter for counting the oscillations of the oscillating signal.

21. The semiconductor circuit device according to claim 18, wherein said oscillator comprises a ring oscillator.

22. A semiconductor circuit device, comprising:
   an oscillator for outputting an oscillating signal;
   a driving signal generator for generating driving signals having respective phases based on a counting of oscillations of the oscillator signal, wherein the driving signals each have a signal edge portion which is synchronous with a signal edge portion of the oscillating signal and the operation timing ratio of the driving signals is constant irrespective of the frequency of the oscillations; and
   a charge pump circuit driven by the driving signals.

23. The semiconductor circuit device according to claim 22, wherein said charge pump circuit outputs a voltage more positive than a power supply voltage Vcc.

24. The semiconductor circuit device according to claim 22, wherein said charge pump circuit outputs a voltage more negative than a power supply voltage Vss.

25. A semiconductor memory device comprising:
   a memory cell array comprising memory cells arranged in rows and columns;
   a row decoder for selecting rows of said memory cell array;
   a column decoder for selecting columns of said memory cell array;
   an oscillator for outputting an oscillating signal;
   a driving signal generator for generating driving signals having respective phases based on a counting of oscillations of the oscillator signal, wherein the driving signals each have a signal edge portion which is synchronous with a signal edge portion of the oscillating signal and the operation timing ratio of the driving signals is constant irrespective of the frequency of the oscillating signal output by said oscillator; and
   a charge pump circuit driven by the driving signals for outputting a voltage to said row decoder.

26. The semiconductor memory device according to claim 25, wherein said charge pump circuit outputs a voltage more positive than a power supply voltage Vcc.

27. A semiconductor device, comprising:
   a power source potential level shifter for shifting a power source potential level; and
   a driver for driving said power source potential level shifter, said driver outputting, responsive to a counting of oscillations of at least one basic pulse, at least two driving pulses which each have a pulse edge synchronous with a pulse edge of said basic pulse and which differ in phase from each other and the operation timing ratio of the driving signals is constant irrespective of the frequency of the at least one basic pulse,
   wherein said power source potential level shifter is driven by said driving pulses.

28. The semiconductor device according to claim 27, wherein said driving pulses have a pulse width N times as large as a half period of said basic pulse, where N is an integer.

29. A semiconductor device, comprising:
   a power source potential level shifter for shifting a power source potential level; and
   a driver for driving said power source potential level shifter, said driver outputting, responsive to a counting of oscillations of at least two basic pulses, at least four driving pulses which each have a pulse edge synchronous with a pulse edge of each of said basic pulses and which differ in phase from each other,
   wherein said at least two basic pulses include a first basic pulse and a second basic pulse each having the same period, the phases of said first and second basic pulses deviating from each other by a quarter of said period,
   said driving pulses include:
      first and second driving pulses each having a pulse edge synchronous with a pulse edge of said first basic pulse, said first and second driving pulses alternately repeating a high level period, which is five times as large as a half-period of the basic pulses, and a low level period, which is three times as large as said half-period of the basic pulses, the phases of said first and second driving pulses deviating from each other by a period which is four times as large as the half period of said basic pulses; and
      third and fourth driving pulses each having a pulse edge synchronous with a pulse edge of said second basic pulse, said third and fourth driving pulses alternately repeating a high period which is twice as large as said half-period of the basic pulses, and a low level period which is six times as large as said half-period of the basic pulses, the phases of the third and fourth driving pulses deviating from each other by a period which is twice as large as said half-period of the basic pulses,
   the relationship among a period T1, a period T2, and a period T3 is represented by $T1:T2:T3 = 2:1:4$, where the period T1 is one from a rising pulse edge of the first driving pulse to a falling pulse edge of the second driving pulse and from a rising pulse edge of the second driving pulse to a falling pulse edge of the first driving pulse, the period T2 is one from the falling pulse edge of the second driving pulse to a rising edge pulse of the third driving pulse and from a falling edge pulse of the third driving pulse to the rising pulse edge of the second driving pulse, and the period T3 is when the third driving pulse and the fourth driving pulse are at high level, and wherein said power source potential level shifter is driven by said driving pulses.

* * * * *